(12) United States Patent
Yang et al.

(10) Patent No.: US 11,637,154 B2
(45) Date of Patent: Apr. 25, 2023

(54) DISPLAY DEVICE AND METHOD FOR MANUFACTURING THE SAME

(71) Applicant: Samsung Display Co., Ltd., Yongin-si (KR)

(72) Inventors: Sung-Jin Yang, Cheonan-si (KR); Hyunsik Park, Cheonan-si (KR); Chungi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 253 days.

(21) Appl. No.: 17/017,570

(22) Filed: Sep. 10, 2020

(65) Prior Publication Data

US 2021/0083014 A1    Mar. 18, 2021

(30) Foreign Application Priority Data

Sep. 18, 2019  (KR) .......................... 10-2019-0114592

(51) Int. Cl.
*H01L 27/32* (2006.01)
*H01L 51/52* (2006.01)
*H01L 51/56* (2006.01)

(52) U.S. Cl.
CPC ........ *H01L 27/323* (2013.01); *H01L 27/3276* (2013.01); *H01L 51/524* (2013.01); *H01L 51/56* (2013.01)

(58) Field of Classification Search
CPC . H01L 27/323; H01L 27/3276; H01L 51/524; H01L 51/56; H01L 2227/323; H01L 27/3244; H01L 51/5203; G06F 3/0412; G06F 3/04164; G06F 2203/04111; G06F 3/0443; G06F 3/0446; G06F 3/04166; G06F 3/044; G06F 3/041
See application file for complete search history.

(56) References Cited

U.S. PATENT DOCUMENTS

| 9,213,452 | B2 | 12/2015 | Sekiguchi et al. |
| 9,798,426 | B2 | 10/2017 | Kim et al. |
| 2011/0057893 | A1 | 3/2011 | Kim et al. |
| 2016/0315284 | A1* | 10/2016 | Jeon .................... H01L 51/5246 |
| 2017/0153725 | A1* | 6/2017 | Park ...................... G06F 3/0412 |
| 2019/0129541 | A1 | 5/2019 | Kwon et al. |

FOREIGN PATENT DOCUMENTS

| JP | 5730593 | 8/2012 |
| KR | 10-1082293 | 3/2011 |
| KR | 10-2015-0052682 | 5/2015 |
| KR | 10-2017-0077942 | 7/2017 |
| KR | 10-2017-0106621 | 9/2017 |
| KR | 10-1810892 | 12/2017 |

* cited by examiner

*Primary Examiner* — Kyoung Lee
(74) *Attorney, Agent, or Firm* — H.C. Park & Associates, PLC

(57) ABSTRACT

A display device includes: a display panel; and an input sensing unit disposed on the display panel and including an active area and a peripheral area adjacent to the active area; wherein the input sensing unit includes: a first conductive layer disposed on at least the peripheral area; a first insulation layer disposed on the first conductive layer exposing at least a portion of the first conductive layer; a second conductive layer disposed on the first insulation layer and including sensing patterns; and a second insulation layer including an organic material disposed on the second conductive layer.

20 Claims, 22 Drawing Sheets

DISPLAY DEVICE AND METHOD FOR MANUFACTURING THE SAME

CROSS-REFERENCE TO RELATED APPLICATION

This application claims priority from and the benefit of Korean Patent Application No. 10-2019-0114592, filed on Sep. 18, 2019, which is hereby incorporated by reference for all purposes as if fully set forth herein.

BACKGROUND

Field

Exemplary implementations of the invention relate generally to a display device and a method for manufacturing the same, and more particularly, to a display device having a simplified process and a reduced manufacturing cost, and a method for manufacturing the same.

Various display devices used in multimedia equipment such as televisions, mobile phones, table computers, navigation devices, and game consoles are being developed. Such a display device includes a keyboard or a mouse as an input unit. Also, the display device includes a touch panel as the input unit.

SUMMARY

Display devices constructed and methods according to exemplary implementations of the invention have a simplified manufacturing process and a reduced manufacturing cost.

For example, when an insulation layer disposed at the uppermost side of the insulation layer in the input sensing unit of the display device includes an organic material instead of an inorganic material, the mask process may be omitted to simplify the process and reduce the manufacturing cost. In addition, the organic insulation layer may be formed through the screen printing and may prevent the sensing pattern from being seen from the outside and prevent defects in the sensing line from occurring by moisture and oxygen being introduced from the outside.

In an exemplary method of manufacturing the display device according to the principles of the invention, an organic insulation layer may be formed after forming the insulation layer at the uppermost side of the input sensing unit using an organic material, and the base material contained in the base member of a coupling member connecting the layers of the display device may be cured through the heat and/or light. As a result, out gassing in the organic insulation layer due to the process of curing the base material through the heat and/or light may be prevented, and thus, the organic insulation layer may be maintained stably without changing the insulation properties. Therefore, the reliability of the display device formed through this process may be improved.

Additional features of the inventive concepts will be set forth in the description which follows, and in part will be apparent from the description, or may be learned by practice of the inventive concepts.

According to one aspect of the invention, a display device includes: a display panel; and an input sensing unit disposed on the display panel and having an active area and a peripheral area adjacent to the active area; wherein the input sensing unit includes: a first conductive layer disposed on at least the peripheral area; a first insulation layer disposed on the first conductive layer exposing at least a portion of the first conductive layer; a second conductive layer disposed on the first insulation layer and having sensing patterns; and a second insulation layer including an organic material disposed on the second conductive layer.

The organic material may include a polyester.

The sensing patterns may include first sensing patterns overlapping the active area and second sensing patterns spaced apart from the first sensing patterns, and the second conductive layer may further include first connection patterns to connect two adjacent first sensing patterns of the first sensing patterns to each other, and the first conductive layer may include second connection patterns to connect two adjacent second sensing patterns of the second sensing patterns to each other.

The first conductive layer may include: sensing lines disposed on the peripheral area; and pads connected to respective ones of the sensing lines.

The second conductive layer may further include auxiliary pads respectively connected to the pads.

The first insulation layer may include: a first contact hole defined in the active area to connect a corresponding second connection pattern to a second sensing pattern; and a second contact hole defined in the peripheral area to connect a corresponding pad to an auxiliary pad.

The second insulation layer may overlap the sensing patterns and the sensing lines.

The second insulation layer may include an opening through which the auxiliary pads are exposed.

The second conductive layer may include a transparent conductive oxide.

The first conductive layer may include a metal material.

The display panel may include: a display substrate; a display element layer disposed on the display substrate; and an encapsulation layer to seal the display element layer; wherein the first conductive layer is disposed on the encapsulation layer.

The encapsulation layer may include an encapsulation substrate, and the display panel may further include a member to connect the encapsulation substrate to the display substrate.

The member may be a coupling member including a cured base material.

According to another aspect of the invention, a method of manufacturing a display device includes the steps of: preparing a display panel; and forming an input sensing unit on the display panel by: forming a base member from a base material to provide a base surface; forming a first conductive layer on the base member; forming a first insulation layer on the first conductive layer to expose at least a portion of the first conductive layer; depositing a transparent conductive oxide on the first insulation layer to form a second conductive layer; curing the base material; and forming a second insulation layer including an organic material on the second conductive layer.

The step of forming of the second insulation layer may include applying the organic material through a screen printing method.

The organic material may include a polyester.

The step of forming the second conductive layer may include forming: first sensing patterns and second sensing patterns spaced apart from the first sensing patterns, and first connection patterns connecting two adjacent first sensing patterns of the first sensing patterns to each other, and the step of forming the first conductive layer may include forming second connection patterns connecting two adjacent second sensing patterns of the second sensing patterns to each other.

The first conductive layer may include sensing lines; and pads connected to respective sensing lines.

The second conductive layer may further include auxiliary pads connected to respective pads.

The second insulation layer may overlap the sensing patterns and the sensing lines and may have an opening through which the auxiliary pads may be exposed.

The base member may include an encapsulation substrate forming a base surface on which the first conductive layer may be formed; and a member connecting the encapsulation substrate to the display panel, wherein the member may be formed from the base material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
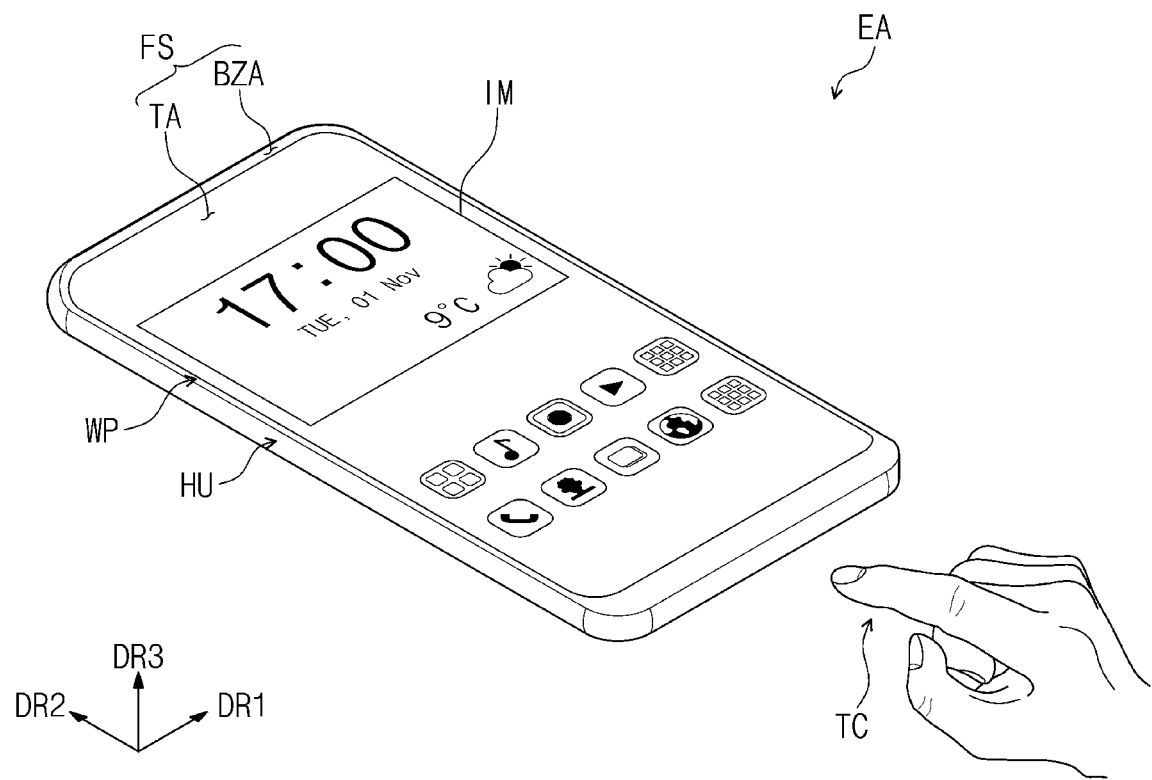
FIG. 1 is a perspective view of an exemplary embodiment of an assembled display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
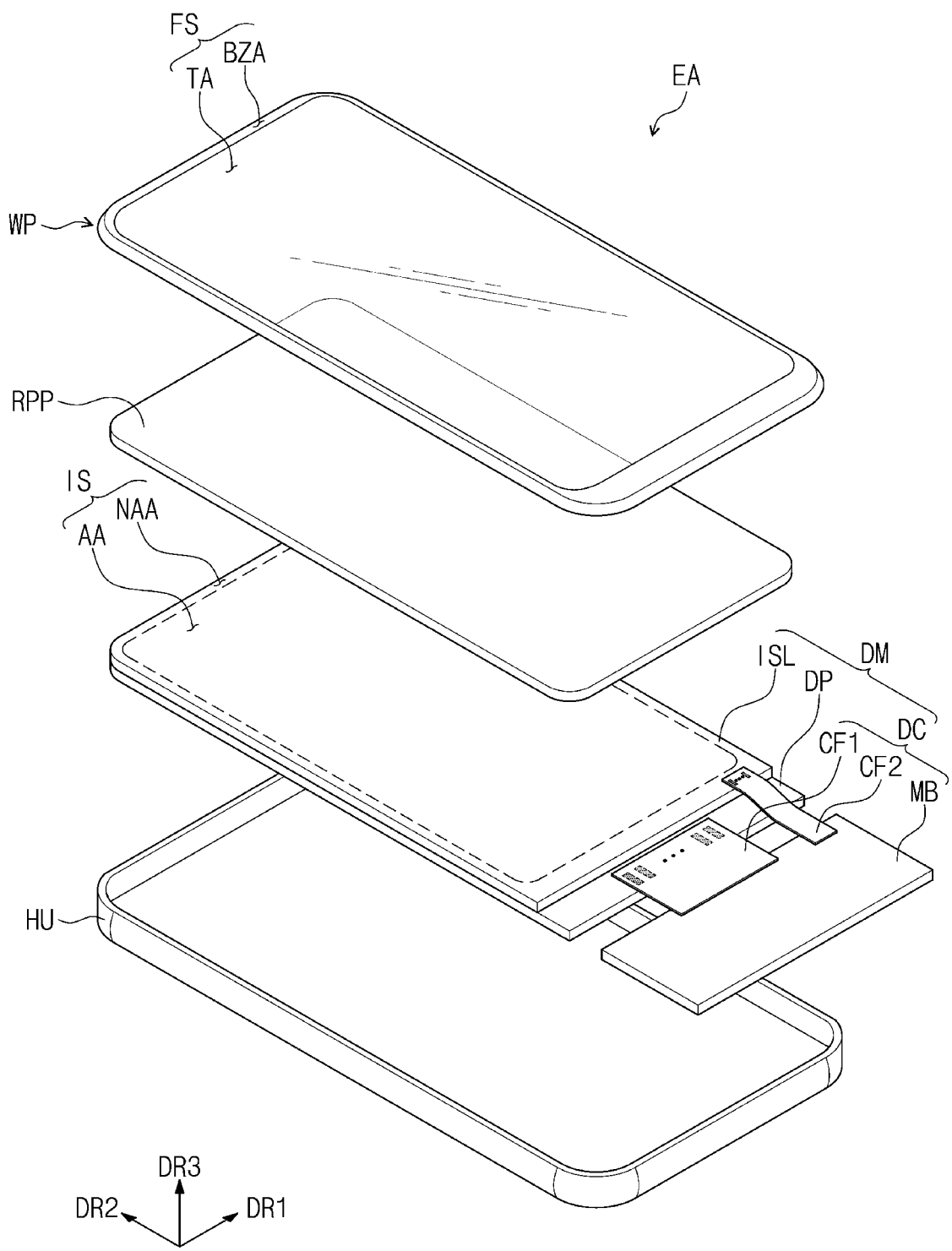
FIG. 2 is an exploded perspective view of the display device of FIG. 1.

FIG. 1 is a perspective view of an exemplary embodiment of an assembled display device constructed according to principles of the invention. FIG. 2 is an exploded perspective view of the display device of FIG. 1.

Referring to FIGS. 1 and 2, a display device EA may be a device that is activated according to an electrical signal. The display device EA may be realized through various embodiments. For example, the display device EA may be used for large electronic devices such as a television, a monitor, or an external billboard as well as small and middle electronic devices such as a personal computer, a notebook computer, a personal digital terminal, a car navigation unit, a game console, a portable electronic device, and a camera. Also, the above-described devices are exemplified as merely an exemplary embodiment, and thus, the display device EA may be adopted for other electronic equipment. In this illustrated exemplary embodiment, the display device EA is described as a smart phone for an example.

The display device EA may display an image IM in the third direction DR3 on a display surface FS generally parallel to each of the first and second directions DR1 and DR2. The image IM may include a still image as well as a dynamic image. In FIG. 1, the image IM is shown as a watch window and icons as an example. A display surface FS on which the image IM is displayed may correspond to a front surface of the display device EA and also correspond to a front surface of a window panel WP.

In this illustrated exemplary embodiment, a front surface (or a top surface) or a rear surface (or a bottom surface) of each of members may be defined based on a direction in which the image IM is displayed. The front and rear surfaces may face each other in a third direction DR3. A normal direction of each of the front and rear surfaces may be generally parallel to the third direction DR3. The directions indicated as the first to third directions DR1, DR2, and DR3 may be a relative concept and thus changed into different directions. Hereinafter, the first to third directions may be directions indicated by the first to third directions DR1, DR2, and DR3 and designated by the same reference numerals, respectively. In this specification, the term "in plan" means when viewed in the third direction DR3.

The display device EA may include a window panel WP, an antireflection panel RPP, a display module DM, and a housing HU. In the illustrated exemplary embodiment, the window panel WP and the housing HU are coupled to each other to define an outer appearance of the display device EA.

The window panel WP may include an optically transparent insulation material. For example, the window panel WP may include a glass or a plastic. The window panel WP may have a single-layered structure or a multi-layered structure. For example, the window panel WP may include a plurality of plastic films bonded to each other by using an adhesive or include a glass substrate and a plastic film, which are bonded to each other by using an adhesive.

A front surface FS of the window panel WP may define the front surface of the display device EA as described above. The transmission area TA may be an optically transparent area. For example, the transmission area TA may be an area having a visible light transmittance of about 90% or more.

The bezel area BZA may be an area having light transmittance that is relatively less than that of the transmission area TA. The bezel area BZA defines the shape of the transmission area TA. The bezel area BZA may be disposed adjacent to the transmission area TA to surround the transmission area TA.

The bezel area BZA may have a predetermined color. The bezel area BZA may cover a peripheral area NAA of the display module DM to prevent the peripheral area NAA from being visible from the outside. However, this is merely an example. For example, in the window panel WP according to an exemplary embodiment, the bezel area BZA may be omitted.

The antireflection panel RPP may be disposed below the window panel WP. The antireflection panel RPP reduces reflectance of external light incident from the upper side of the window panel WP. In some exemplary embodiments, the antireflection panel RPP may be omitted or may be provided as a component included in the display module DM.

The display module DM may display the image IM and sense an external input TC. The external input TC may include various types of inputs provided from the outside of the display module DM. The external input TC applied from the outside may be provided in various forms.

For example, the external input TC may include an external input (for example, hovering) applied to be proximity to or adjacent by a predetermined distance to the display module DM as well as to contact a portion of the human body such as user's hands. Also, the input may be provided as various forms such as force, a pressure, light, and the like and is not limited to any one exemplary embodiment. FIG. 1 illustrates the user's finger as an example of the external input TC.

The display module DM includes a front surface IS including an active area AA and a peripheral area NAA. The active area AA may be an area that is activated according to an electrical signal.

In this illustrated exemplary embodiment, the active area AA may be an area on which the image IM is displayed, and also, the external input is sensed. The transmission area TA overlaps at least the active area AA. For example, the transmission area TA overlaps an entire surface of at least a portion of the active area AA. Thus, a user may see the image IM or provide the external input TC through the transmission area TA. However, this is merely an example. For example, the area of the active area AA, on which the image IM is displayed, and the area of the active area AA, on which the external input is sensed, may be separated from each other, but some exemplary embodiments are not limited to this illustrated embodiment.

The peripheral area NAA may be the area covered by the bezel area BZA. The peripheral area NAA is adjacent to the active area AA. The peripheral area NAA may surround the active area AA. A driving circuit or a driving line for driving the active area AA may be disposed on the peripheral area NAA.

The display module DM includes a display panel DP, an input sensing unit ISL, and a driving circuit DC.

The display panel DP may be a constituent that substantially generates the image IM. The image IM generated by the display panel DP may be visible from the outside by the user through the transmission area TA.

The input sensing unit ISL senses an external input applied from the outside. As described above, the input sensing unit ISL may sense the external input provided to the window panel WP.

The driving circuit DC is electrically connected to the display panel DP and the input sensing unit ISL. The driving circuit DC includes a main circuit board MB, a first circuit board CF1, and a second circuit board CF2.

The first circuit board CF1 is electrically connected to the display panel DP. The first circuit board CF1 may connect the display panel DP to the main circuit board MB. In this illustrated exemplary embodiment, the first circuit board CF1 is provided as a flexible circuit film. However, this is only an example. For example, the first circuit board CF1 may not be connected to the main circuit board MB, and the first circuit board CF1 may be a rigid board.

The first circuit board CF1 may be connected to pads (display pads) of the display panel DP disposed on the peripheral area NAA. The first circuit board CF1 provides an electrical signal for driving the display panel DP to the display panel DP. The electrical signal may be generated in the first circuit board CF1 or generated in the main circuit board MB.

The second circuit board CF2 is electrically connected to the input sensing unit ISL. The second circuit board CF2 may connect the input sensing unit ISL to the main circuit board MB. In this illustrated exemplary embodiment, the second circuit board CF2 is provided as a flexible circuit film. However, this is only an example. For example, the second circuit board CF2 may not be connected to the main circuit board MB, and the second circuit board CF2 may be a rigid board.

The second circuit board CF2 may be connected to pads (sensing pads) of the input sensing unit ISL disposed on the peripheral area NAA. The second circuit board CF2 provides an electrical signal for driving the input sensing unit ISL to the input sensing unit ISL. The electrical signal may be generated in the second circuit board CF2 or generated in the main circuit board MB.

The main circuit board MB may include various driving circuits for driving the display module DM and a connector for supplying power. Each of the first circuit board CF1 and the second circuit board CF2 may be connected to the main circuit boards MB. The display module DM may be easily controlled through one main circuit board MB. However, this is merely an example. In the display module according to an exemplary embodiment, the display panel DP and the input sensing unit ISL may be respectively connected to different main boards, or one of the first circuit board CF1 and the second circuit board CF2 may not be connected to one main circuit board MB, but the exemplary embodiments are not limited to this illustrated embodiment.

The housing HU is coupled to the window panel WP. The housing HU is coupled to the window panel WP to provide a predetermined internal space. The display module DM may be accommodated in the internal space.

The housing HU may include a material having relatively high rigidity. For example, the housing HU may include a glass, a plastic, or a metal or may include a plurality of frames and/or plates made of a combination of a glass, a plastic, and a metal. The housing HU may stably protect the constituents of the display device EA, which are accommodated in the internal space, against an external impact.

Figure 3A:
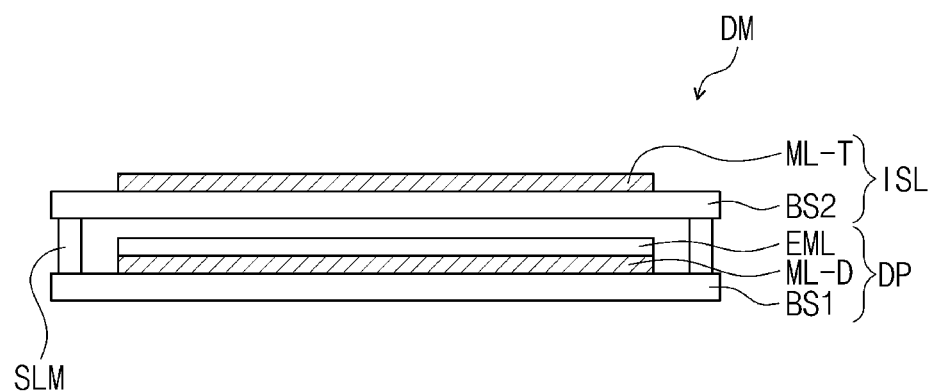
FIG. 3A is a cross-sectional view of the display device of FIG. 1.
Figure 3A:
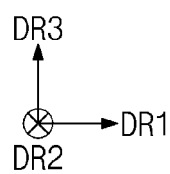

FIG. 3A is a cross-sectional view of the display device of FIG. 1.

Referring to FIG. 3A, the display module DM may include a display panel DP, an input sensing unit ISL, and a coupling member SLM.

The display panel DP may be an emission type display panel, but is not limited thereto. For example, the display panel DP may be an organic light emitting display panel and a quantum-dot light emitting display panel.

The display panel DP may include a first substrate BS1, a display circuit layer ML-D, and a light emitting layer EML. The input sensing unit ISL may include a second substrate BS2 and a sensing circuit layer ML-T.

Each of the first substrate BS1 and the second substrate BS2 may be a silicon substrate, a plastic substrate, an insulation film, or a laminated structure including a plurality of insulation layers. The first substrate BS1 may be a display substrate on which a circuit layer, a display layer, and the like are disposed.

The display circuit layer ML-D may be disposed on the first substrate BS1. The display circuit layer ML-D may include a plurality of insulation layers, a plurality of conductive layers, and a semiconductor layer. A plurality of conductive layers of the display circuit layer ML-D may constitute signal lines or a control circuit of a pixel.

The light emitting layer EML may be disposed on the display circuit layer ML-D. The light emitting layer EML may be a layer that generates light or controls light transmittance. For example, the light emitting layer EML of the organic light emitting display panel may include an organic light emitting material. The light emitting layer EML of the quantum dot light emitting display panel may include at least one of a quantum dot, a quantum rod, or the like. The light emitting layer EML of the liquid crystal display panel may include a liquid crystal layer.

The second substrate BS2 may be disposed on the light emitting layer EML. The second substrate BS2 may be an encapsulation substrate that encapsulates the display panel DP. A predetermined space may be defined between the second substrate BS2 and the light emitting layer EML. The space may be filled with air or an inert gas. Also, in an exemplary embodiment, the space may include a filler such as a silicone-based polymer, an epoxy-based resin, or an acrylic-based resin. However, some exemplary embodiments are not limited thereto. For example, a space may not be defined between the light emitting layer EML and the second substrate BS2, and the light emitting layer EML and the second substrate BS2 may contact each other.

The sensing circuit layer ML-T may be disposed on the second substrate BS2. The sensing circuit layer ML-T may include a plurality of insulation layers and a plurality of conductive layers. The plurality of conductive layers constitute a sensing electrode that senses the external input, a sensing line connected to the sensing electrode, and a sensing pad connected to the sensing line.

The coupling member SLM may be disposed between the first substrate BS1 and the second substrate BS2. The coupling member SLM may connect the first substrate 1 to the second substrate 2. The coupling member SLM may include an organic material such as a photocurable resin or a photoplastic resin or may include an inorganic material such as a frit seal, but the exemplary embodiments are not limited to a specific material.

Figure 3B:
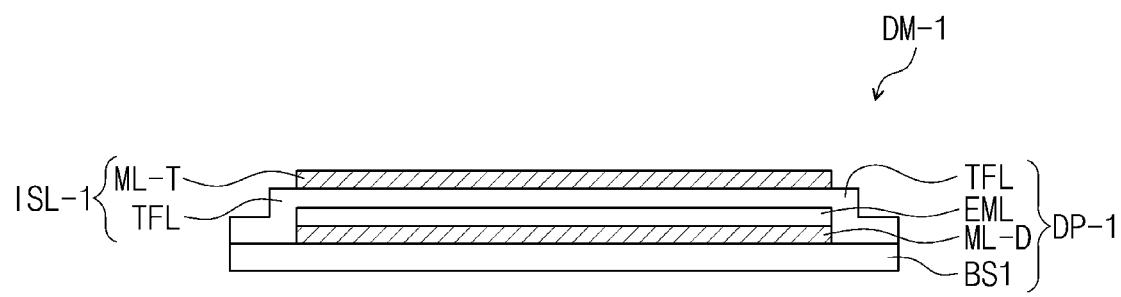
FIG. 3B is a cross-sectional view of a display device of FIG. 1 according to another exemplary embodiment.
Figure 3B:
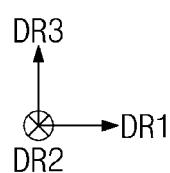

FIG. 3B is a cross-sectional view of a display device of FIG. 1 according to another exemplary embodiment.

Referring to FIG. 3B, a display module DM-1 may include a display panel DP-1 and an input sensing unit ISL-1. The input sensing unit ISL-1 may be referred to as an input sensing layer.

The display panel DP-1 may include the first substrate BS1, the display circuit layer ML-D, the light emitting layer EML, and a thin film encapsulation layer TFL. The input sensing unit ISL-1 may include a base layer TFL and a sensing circuit layer ML-T. The thin film encapsulation layer TFL and the base layer TFL may be the same configuration.

According to an exemplary embodiment, the display panel DP-1 and the input sensing unit ISL-1 may be formed through a continuous process. That is, the sensing circuit layer ML-T may be directly disposed on the thin film encapsulation layer TFL.

Figure 4:
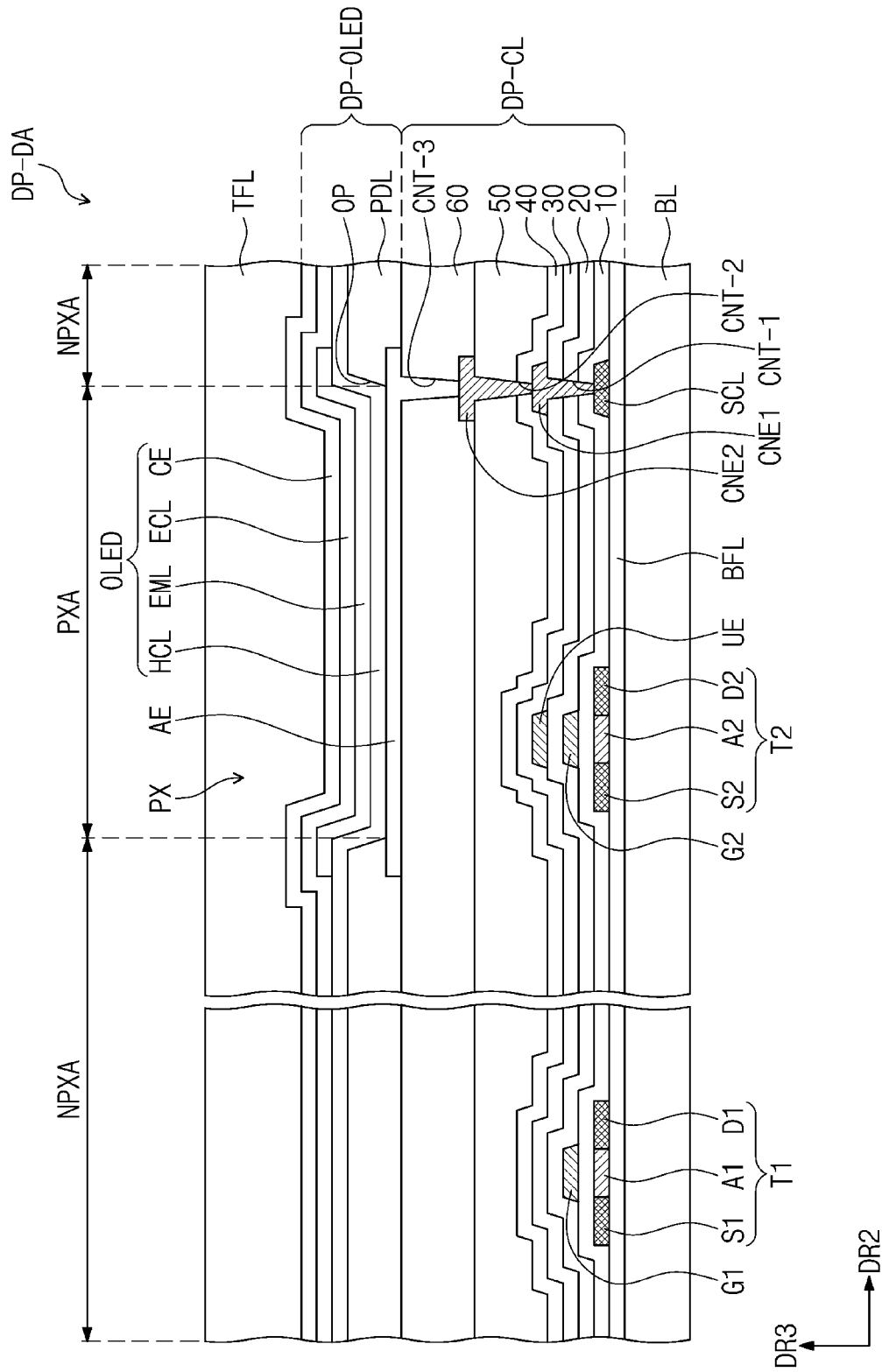
FIG. 4 is an enlarged cross-sectional view of an exemplary embodiment of a display area constructed according to principles of the invention.

FIG. 4 is an enlarged cross-sectional view of an exemplary embodiment of a display area constructed according to principles of the invention.

Referring to FIG. 4, the display area DP-DA of a display panel may include a plurality of insulation layers, a semiconductor pattern, a conductive pattern, a signal line, and the like. The insulation layer, the semiconductor layer, and the conductive layer may be formed through methods such as coating, deposition, and the like. Thereafter, the insulation layer, the semiconductor layer, and the conductive layer may be selectively patterned in a photolithography manner. The semiconductor pattern, the conductive pattern, and the signal line, which are provided in the circuit element layer DP-CL and the display element layer DP-OLED, may be formed in the above-described manner.

The base layer BL may include a synthetic resin film. The synthetic resin layer may include a thermosetting resin. The base layer BL may have a multi-layered structure. For example, the base layer BL may have a three-layer structure of a synthetic resin layer, an adhesive layer, and a synthetic resin layer. Particularly, the synthetic resin layer may be a polyimide resin layer, and the material thereof is not particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. In addition, the synthetic resin layer may include a glass substrate, a metal substrate, or an organic/inorganic composite substrate.

At least one inorganic layer may be disposed on a top surface of the base layer BL. The inorganic layer may include at least one of an oxide, a titanium oxide, a silicon oxide, a silicon oxide nitride, a zirconium oxide, or a hafnium oxide. The inorganic layer may be provided as a multi-layer. The multi-layered inorganic layer may constitute a barrier layer and/or a buffer layer. In illustrated embodiments, the display area DP-DA of the display panel may include the buffer layer BFL.

The buffer layer BFL improves bonding force between the base layer BL and the semiconductor pattern. The buffer layer BFL may include a silicon oxide layer and a silicon nitride layer. The silicon oxide layer and the silicon nitride layer may be alternately laminated.

The semiconductor pattern is disposed on the buffer layer BFL. The semiconductor pattern may include a polysilicon. However, some exemplary embodiments are not limited thereto. For example, the semiconductor pattern may include an amorphous silicon or a metal oxide.

FIG. 4 illustrates merely a portion of the semiconductor pattern. For example, the semiconductor pattern may be further disposed on other areas of the representative pixel PX in plan. The semiconductor pattern may be arranged in a specific rule over the pixels PX. The semiconductor pattern has different electrical properties depending on whether the semiconductor pattern is doped. The semiconductor pattern may include a doped region and a non-doped region. The doped region may be doped with an N-type dopant or a P-type dopant. A P-type transistor includes a doped region into which the P-type dopant is doped.

The doped region may have conductivity greater than that of the non-doped region and substantially act as an electrode or a signal line. The non-doped region may substantially correspond to an active (or a channel) of the transistor. That is to say, a portion of the semiconductor pattern may be an active region of the transistor, another portion may be a source or drain region of the transistor, and further another portion may be a connection electrode or a connection signal line.

As illustrated in FIG. 4, a source S1, an active A1, and a drain D1 of a first transistor T1 may be formed from the semiconductor pattern, and a source S2, an active A2, and a drain D2 of the second transistor T2 of the second transistor T2 may be formed from the semiconductor pattern. The sources S1 and S2 and the drains D1 and D2 extend from the actives A1 and A2 in directions opposite to each other. FIG. 4 illustrates a portion of the connection signal line SCL formed from the semiconductor pattern. The connection signal line SCL may be connected to the drain D2 of the second transistor T2 in plan.

A first insulation layer 10 is disposed on the buffer layer BFL. The first insulation layer 10 commonly overlaps the plurality of pixels PX (see FIGS. 4A and 4B) and covers the semiconductor pattern. The first insulation layer 10 may include an inorganic layer and/or an organic layer and have a single-layered or multi-layered structure. The first insulation layer 10 may include at least one of an oxide, a titanium oxide, a silicon oxide, a nitride, a zirconium oxide, or a hafnium oxide. In an illustrated embodiment, the first insulation layer 10 may include a single-layered silicon oxide layer. The insulation layer of the circuit element layer DP-CL, which will be described below, as well as the first insulation layer 10 may be an inorganic layer and/or an organic layer and may have a single-layered or a multi-layered structure. The inorganic layer may include at least one of the above-described materials.

Gates G1 and G2 are disposed on the first insulation layer 10. Each of the gates G1 and G2 may be a portion of the metal pattern. The gates G1 and G2 overlap the actives A1 and A2. In the process of doping the semiconductor pattern, the gates G1 and G2 may serve as masks.

A second insulation layer 20 covering the gates G1 and G2 is disposed on the first insulation layer 10. The second insulation layer 20 commonly overlaps the pixels PX (see FIGS. 5A and 5B). The second insulation layer 20 may include an inorganic layer and/or an organic layer and have a single-layered or multi-layered structure. In the illustrated exemplary embodiment, the first insulation layer 20 may include a single-layered silicon oxide layer.

An upper electrode UE may be disposed on the second insulation layer 20. The upper electrode UE may overlap the gate G2 of the second transistor T2. The upper electrode UE may be a portion of the metal pattern. A portion of the gate G2 and the upper electrode UE overlapping the portion of the gate G2 may define a capacitor CP (as depicted in FIG. 5B). In some exemplary embodiments, the upper electrode UE may be omitted.

A third insulation layer 30 covering the upper electrode UE is disposed on the second insulation layer 20. In an illustrated embodiment, the third insulation layer 30 may include a single-layered silicon oxide layer. The first connection electrode CNE1 may be disposed on the third insulation layer 30. The first connection electrode CNE1 may be connected to the signal line SCL through a contact hole CNT-1 passing through the first to third insulation layers 10 to 30.

A fourth insulation layer 40 covering the first connection electrode CNE1 is disposed on the third insulation layer 30. The fourth insulation layer 40 may be a single-layered silicon oxide layer. The fourth insulation layer 40 is disposed on a fifth insulation layer 50. The fifth insulation layer 50 may be an organic layer. A second connection electrode CNE2 may be disposed on the fifth insulation layer 50. The second connection electrode CNE2 may be connected to the first connection electrode CNE1 through a contact hole CNT-2 passing through the fourth insulation 40 and the fifth insulation layer 50.

A sixth insulation layer 60 covering the second connection electrode CNE2 is disposed on the fifth insulation layer 50. The sixth insulation layer 60 may be an inorganic layer. A first electrode AE is disposed on the sixth insulation layer 60. The first electrode AE is connected to the second connection electrode CNE2 through a contact hole CNT-3 passing through the sixth insulation layer 60. An opening OP is defined in the pixel defining layer PDL. The opening OP of the pixel defining layer PDL exposes at least a portion of the first electrode AE.

As illustrated in FIG. 4, the display area DP-DA may include an emission area PXA and a non-emission area NPXA adjacent to the emission area PXA. The non-emission area NPXA may surround the emission area PXA. In the illustrated exemplary embodiment, the emission area PXA may be defined to correspond to a portion of the area of the first electrode AE exposed by the opening OP.

A hole control layer HCL may be commonly disposed on the emission area PXA and the non-emission area NPXA. The hole control layer HCL may include a hole transport layer and may further include a hole injection layer. The light emitting layer EML is disposed on the hole control layer HCL. The light emitting layer EML may be disposed on the area corresponding to the opening OP. That is, the light emitting layer EML may be formed to be separated from each of the pixels PX.

An electron control layer ECL is disposed on the light emitting layer EML. The electron control layer ECL may include an electron transport layer and may further include an electron injection layer. The hole control layer HCL and the electron control layer ECL may be formed commonly on the plurality of pixels by using an open mask. A second electrode CE is disposed on the electron control layer ECL. The second electrode CE is provided as a single body and commonly disposed on the plurality of pixels PX (see FIG. 5A).

The thin film encapsulation layer TFL is disposed on the second electrode CE. The encapsulation layer TFL may include a plurality of thin films. The thin film encapsulation layer TFL may include at least one inorganic encapsulation layer and an organic encapsulation layer. For example, the thin film encapsulation layer TFL may include a structure in which one organic encapsulation layer is disposed between two inorganic encapsulation layers. The inorganic encapsulation layer may be a layer that protects the display element layer DP-OLED from moisture/oxygen. The inorganic encapsulation layer may be any one of a silicon nitride layer, a silicon oxy nitride layer, and a silicon oxide layer. The inorganic encapsulation layer may be one of a titanium oxide layer or an aluminum oxide layer. The organic encapsulation layer may be a layer that protects the display element layer DP-OLED from foreign substances such as dust particles. The organic encapsulation layer may include an acrylic organic layer. A capping layer may be further disposed between the thin film encapsulation layer TFL and the second electrode CE or on the thin film encapsulation layer TFL.

Figure 5A:
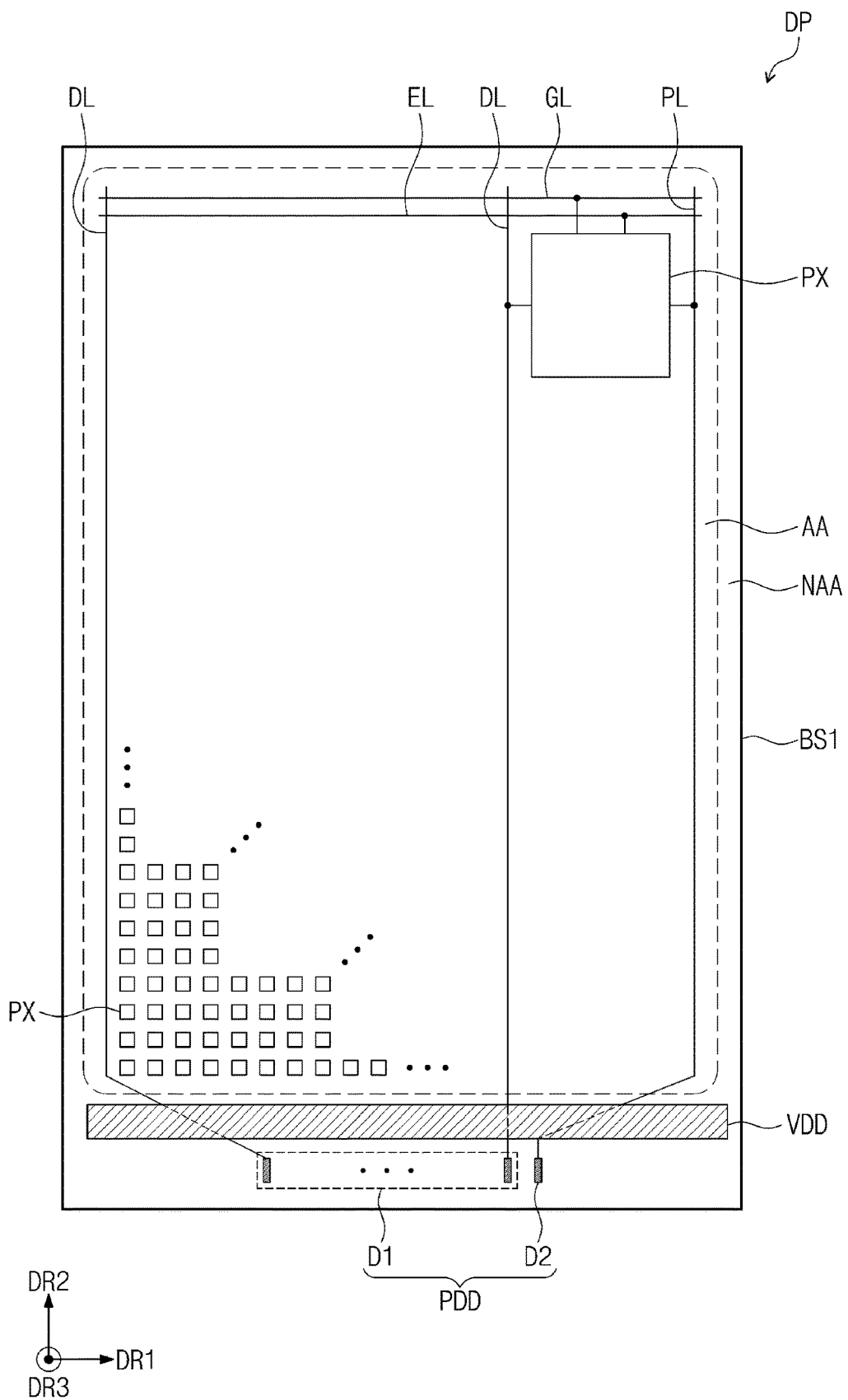
FIG. 5A is a schematic plan view of the display panel of FIG. 3A with a representative pixel shown in an enlarged view.
Figure 5B:
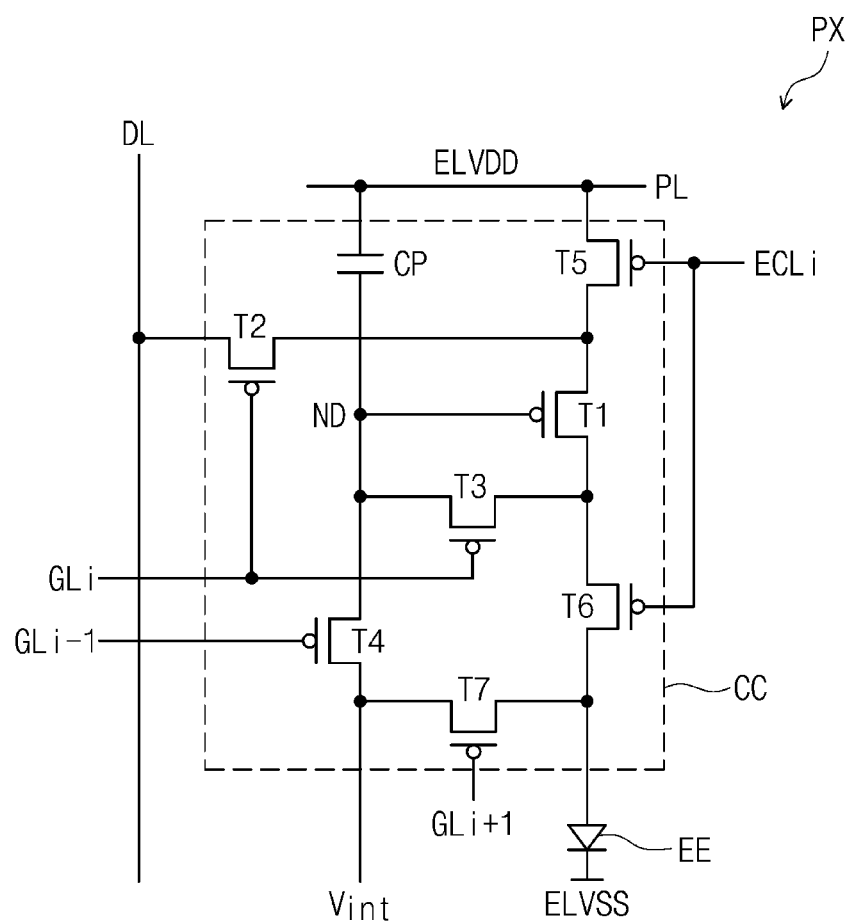
FIG. 5B is an equivalent circuit diagram of the representative pixel of FIG. 5A.

FIG. 5A is a schematic plan view of the display panel of FIG. 3A with a representative pixel shown in an enlarged view. FIG. 5B is an equivalent circuit diagram of the representative pixel of FIG. 5A.

Referring to FIG. 5A, the display panel DP may include a plurality of pixels PX, a plurality of signal lines GL, DL, PL, and EL, and a plurality of display pads PDD.

The active area AA of the display panel DP may be the area, in which an image is displayed, and the peripheral area NAA may be the area on which a driving circuit or driving line is disposed. The active area AA and the peripheral area NAA of the display panel DP are illustrated. A plurality of pixels PX may be disposed on the active area AA.

The plurality of signal lines GL, DL, PL, and EL are connected to the pixels PX to transmit electrical signals to the pixels PX. A scan line GL, a data line DL, a power line PL, and an emission control line EL of the signal lines provided in the display panel DP are illustrated as an example. However, this is merely an example. For example, the signal lines GL, DL, PL, and EL may further include an initialization voltage line, but some exemplary embodiments are not limited to an illustrated embodiment.

Referring to FIG. 5B, a signal circuit diagram of one representative pixel PX of the plurality of pixels is illustrated to be enlarged as an example. FIG. 5B illustrates an example of the pixel PX connected to an i-th scan line GLi and an i-th emission control line ELi.

The pixel PX may include a light emitting element EE and a pixel circuit CC.

The pixel circuit CC may include a plurality of transistors T1 to T7 and a capacitor CP. The plurality of transistors T1 to T7 may be formed through a low temperature polycrystalline silicon (LTPS) process or a low temperature polycrystalline oxide (LTPO) process.

The pixel circuit CC may control the amount of current flowing in the light emitting element EE in response to a data signal. The light emitting element EE may emit light having predetermined luminance corresponding to an amount of current supplied from the pixel circuit CC. For this, the first power ELVDD may be set to a level greater than that of the second power ELVSS. The light emitting element EE may include an organic light emitting element or a quantum dot light emitting element.

Each of the plurality of transistors T1 to T7 may include an input electrode (or a source electrode), an output electrode (or a drain electrode), and a control electrode (or a gate electrode). As described herein, for convenience, either the input electrode or the output electrode may be referred to as a first electrode and the other may be referred to as a second electrode.

The first electrode of the first transistor T1 is connected to a first power source ELVDD via the fifth transistor T5, and the second electrode of the first transistor T1 is connected to an anode electrode of the light emitting element EE via the sixth transistor T6. The first transistor T1 may be called a driving transistor.

The first transistor T1 may control an amount of current flowing in the light emitting element EE according to a voltage applied to the control electrode of the first transistor T1.

The second transistor T2 is connected between the data line DL and the first electrode of the first transistor T1. Also, the control electrode of the second transistor T2 is connected to the i-th scan line GLi. When an i-th scan signal is applied to the i-th scan line GLi, the second transistor T2 may be turned on to electrically connect the data line DL to the first electrode of the first transistor T1.

The third transistor T3 is connected between the second electrode of the first transistor T1 and the control electrode of the first transistor T1. The control electrode of the third transistor T3 is connected to the i-th scan line GLi. When the i-th scan signal is provided to the i-th scan line GLi, the third transistor T3 is turned on to electrically connect the second electrode of the first transistor T1 to the control electrode of the first transistor T1. Thus, when the third transistor T3 is turned on, the first transistor T1 is connected in the form of a diode.

The fourth transistor T4 is connected between a node ND and an initialization power generation unit. Also, the control electrode of the fourth transistor T4 is connected to an (i−1)-th scan line GLi−1. When an (i−1)-th scan signal is provided to the (i−1)-th scan line GLi−1, the fourth transistor T4 is turned on to provide an initialization voltage Vint to the node ND.

The fifth transistor T5 is connected between the power line PL and the first electrode of the first transistor T1. The control electrode of the fifth transistor T5 is connected to the i-th emission control line ECLi.

The sixth transistor T6 is connected between the second electrode of the first transistor T1 and the anode electrode of the light emitting element EE. Also, the control electrode of the sixth transistor T6 is connected to the i-th emission control line ELi.

The seventh transistor T7 is connected between the initialization power generation unit and the anode electrode of the light emitting element EE. Also, the control electrode of the seventh transistor T7 is connected to an (i+1)-th scan line GLi+1. When the (i+1)-th scan signal is provided to the (i+1)-th scan line GLi+1, the seventh transistor T7 is turned on to provide the initialization voltage Vint to the anode electrode of the light emitting element EE.

The seventh transistor T7 may improve black display capability of the pixel PX. Particularly, when the seventh transistor T7 is turned on, a parasitic capacitor of the light emitting element EE is discharged. Thus, when black luminance is implemented, the light emitting element EE does not emit light due to leakage current from the first transistor T1, and thus, the black display performance may be improved.

Additionally, although the control electrode of the seventh transistor T7 is connected to the (i+1)-th scan line GLi+1 in FIG. 5B, some exemplary embodiments are not limited thereto. In other exemplary embodiments, the control electrode of the seventh transistor T7 may be connected to the i-th scan line GLi or the (i−1)-th scan line GLi−1.

The capacitor CP is disposed between the power line PL and the node ND. The capacitor CP stores a voltage corresponding to the data signal. When the fifth transistor T5 and the sixth transistor T6 are turned on according to the voltage stored in the capacitor CP, an amount of current flowing through the first transistor T1 may be determined.

In some exemplary embodiments, an equivalent circuit of the pixel PX is not limited to the equivalent of FIG. 5B. According to other exemplary embodiments, the pixel may have various shapes to allow the light emitting element EE to emit light. Although a PMOS is illustrated in FIG. 5B, some exemplary embodiments are not limited thereto. In other exemplary embodiments, the pixel circuit CC may be constituted by an NMOS. In still other exemplary embodiments, the pixel circuit CC may be constituted by a combination of the NMO and the PMOS.

Referring again to FIG. 5A, a power source pattern VDD is disposed on the peripheral area NAA. In this illustrated exemplary embodiment, the power source pattern VDD is connected to the plurality of power lines PL. Thus, since the display panel DP includes the power source pattern VDD, the same first power signal may be provided to the plurality of pixels.

The display pads PDD may include a first pad D1 and a second pad D2. The first pad D1 may be provided in plurality, and the plurality of first pads D1 may be connected, respectively, to the data lines DL. The second pad D2 may be connected to the power source pattern VDD and electrically connected to the power line PL. The display panel DP may provide electrical signals provided from the outside to the pixels PX through the display pads PDD. The display pads PDD may further include pads for receiving other electrical signals in addition to the first pad D1 and the second pad D2, but are not limited thereto.

Figure 6A:
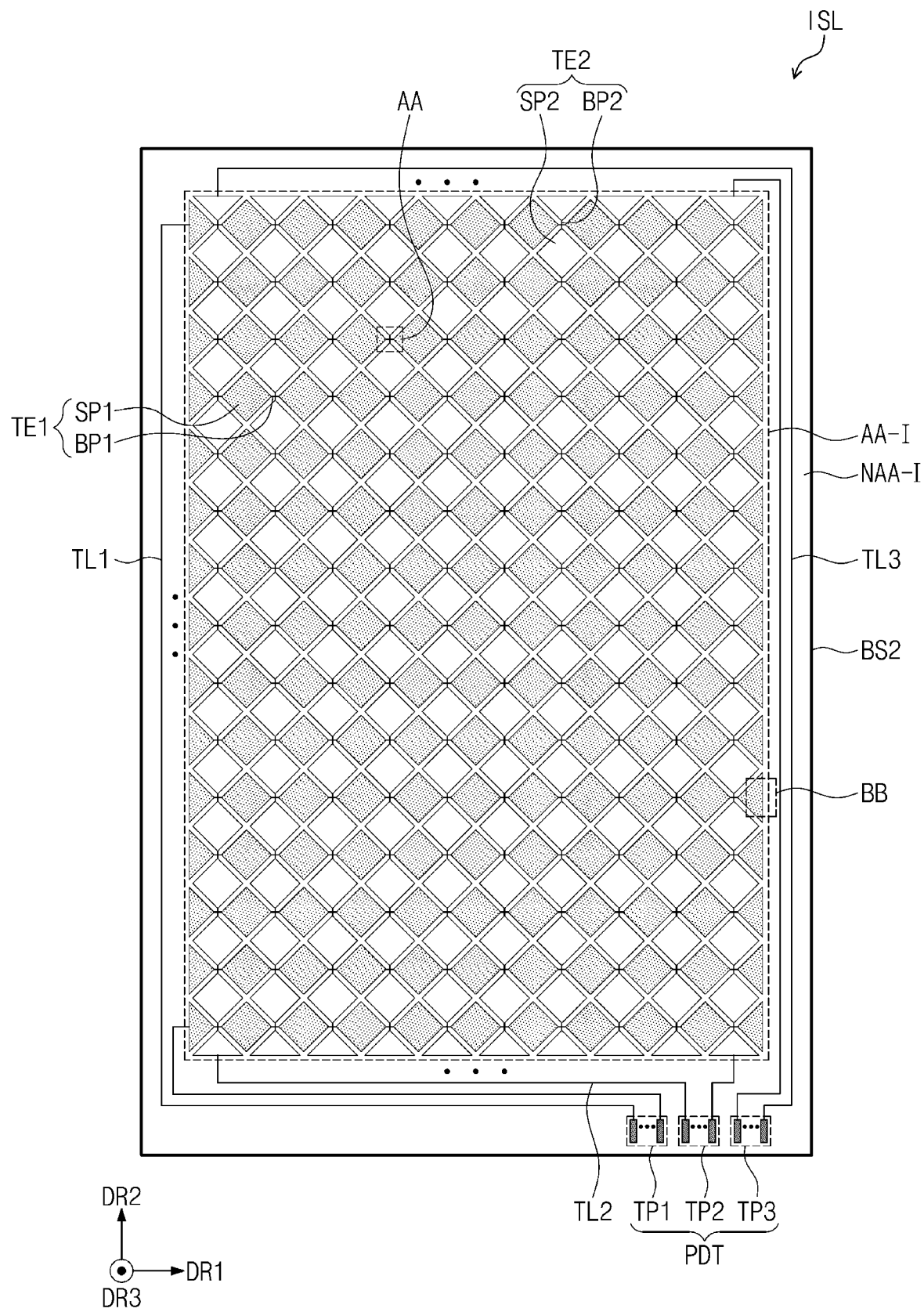
FIG. 6A is a partially cutaway, plan view of an exemplary embodiment of an input sensing unit constructed according to principles of the invention.
Figure 6B:
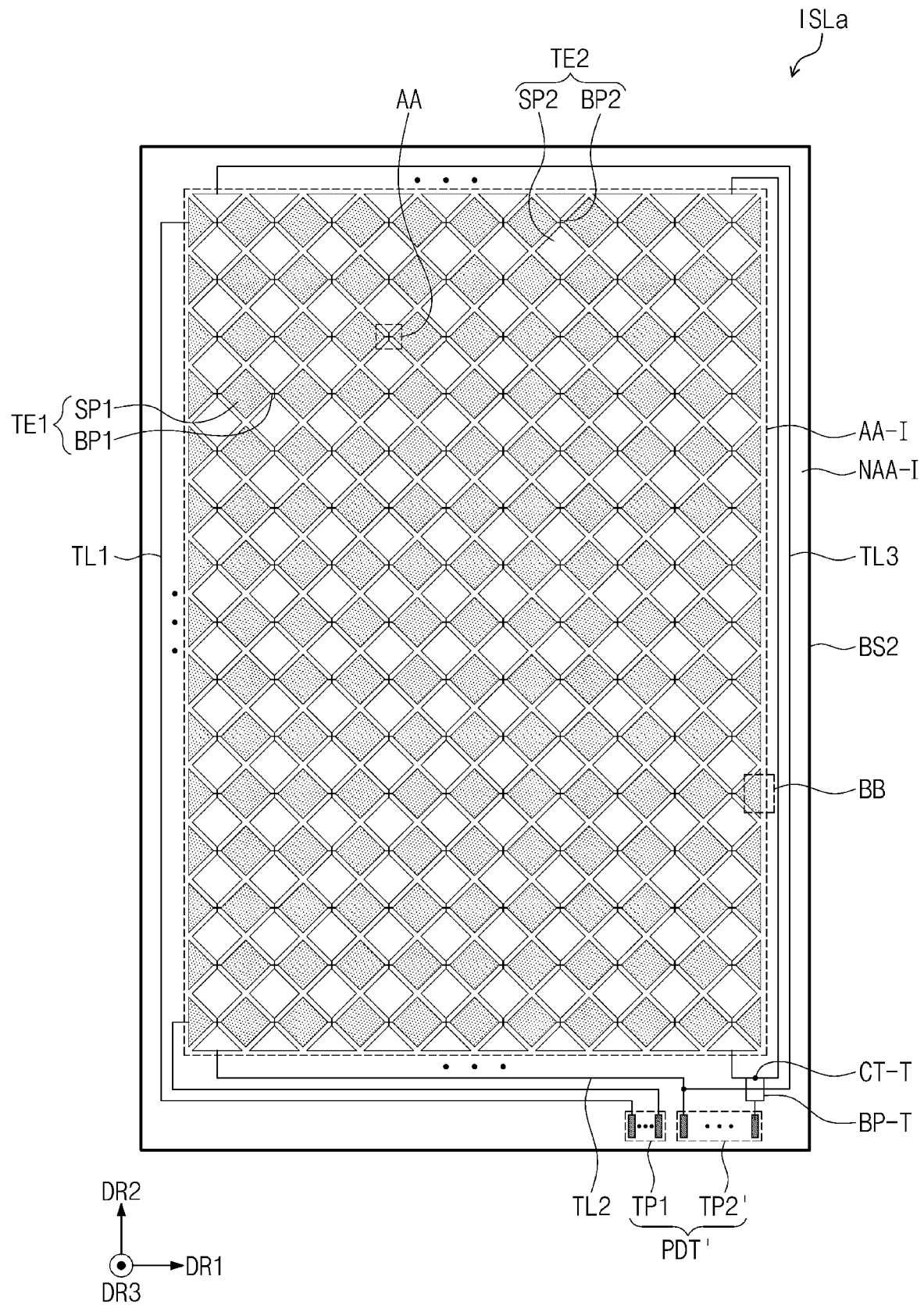
FIG. 6B is a partially cutaway, plan view of another exemplary embodiment of the input sensing unit.

FIG. 6A is a partially cutaway, plan view of an exemplary embodiment of an input sensing unit constructed according to principles of the invention. FIG. 6B is a partially cutaway, plan view of another exemplary embodiment of the input sensing unit. Hereinafter, a description will be given based on the input sensing unit ISL illustrated in FIG. 3A, but the following description may also be applied to the input sensing unit ISL-1 illustrated in FIG. 3B. For clarity, FIGS. 6A and 6B do not show certain elements referenced by and shown in FIGS. 8A, 8B, and 10, as discussed below.

Referring to FIG. 6A, the input sensing unit ISL may include a second substrate BS2, a first sensing electrode TE1, a second sensing electrode TE2, a plurality of sensing lines TL1, TL2, and TL3, and a plurality of sensing pads PDT. The first sensing electrode TE1, the second sensing electrode TE2, the plurality of sensing lines TL1, TL2, and TL3, and the plurality of sensing pads PDT may constitute the sensing circuit layer ML-T (see FIG. 3A).

An active area AA-I and a peripheral area NAA-I may be defined on the second substrate BS2. The peripheral area NAA-I may surround the active area AA-I.

A first control electrode TE1 and a second control electrode TE2 may be disposed on the active area AA-I. The input sensing unit ISL may obtain information on the external input TC through a change in capacitance between the first sensing electrode TE1 and the second sensing electrode TE2.

The first sensing electrodes TE1 may include first sensing patterns SP1 and first connection patterns BP1. At least one first connection pattern BP1 may be connected to two first sensing patterns SP1 adjacent to each other. The second sensing electrode TE2 may include second sensing patterns SP2 and second connection patterns BP2. At least one second connection pattern BP2 may be connected to two second sensing patterns SP2 adjacent to each other. Dummy patterns may be disposed between the first sensing patterns SP1 and the second sensing patterns SP2.

The sensing lines TL1, TL2, and TL3 are disposed on the peripheral area NAA-I. The sensing lines TL1, TL2, and TL3 may include a first sensing line TL1, a second sensing line TL2, and a third sensing line TL3.

The first sensing line TL1 is connected to the first sensing electrode TE1. The second sensing line TL2 is connected to one end of the second sensing electrode TE2. The third sensing lines TL3 are connected to the other end of the second sensing electrode TE2. The other end of the second sensing electrode TE2 may be a portion opposite to one end of the second sensing electrode TE2.

According to some exemplary embodiments, the second sensing electrode TE2 may be connected to the second sensing lines TL2 and the third sensing lines TL3. Thus, sensitivity of the area with respect to the second sensing electrode TE2, which has a length that is relatively longer than that of the first sensing electrode TE1, may be uniformly maintained. However, this is merely an example. For example, the third sensing line TL3 may be omitted.

The sensing pads PDT are disposed on the peripheral area NAA-I. The sensing pads PDT may include a first sensing pad TP1, a second sensing pad TP2, and a third sensing pad TP3. The first sensing pad TP1 is connected to the first sensing line TL1 and electrically connected to the first sensing electrode TE1. The second sensing pad TP2 is connected to the second sensing line TL2, and the third sensing pad TP3 is connected to the third sensing line TL3. Therefore, the second sensing pad TP2 and the third sensing pad TP3 are electrically connected to the second sensing electrode TE2.

The first width of the first sensing line TL1 may be less than the second width of the first sensing pad TP1, the first width of the second sensing line TL2 may be less than the second width of the second sensing pad TP2, and the first width of the third sensing line TL3 may be less than the second width of the third sensing pad TP3.

Referring to FIG. 6B, the third sensing lines TL3 may be connected to the second sensing lines TL2, respectively. The input sensing unit ISLa according to this illustrated exemplary embodiment may include a plurality of contact parts CT-T. The third sensing lines TL3 are electrically connected to corresponding second sensing lines of the second sensing lines TL2 through the contact parts CT-T. Accordingly, the third sensing lines TL3 transmit electrical signals that are, respectively, substantially the same as the second sensing lines TL2. The third sensing lines TL3 are connected to the second sensing lines TL2 through the plurality of bridge patterns BP-T. The bridge patterns BP-T are arranged in the first direction DR1 to extend, respectively, in the second direction DR2. The bridge patterns BP-T insulate and cross the third sensing lines TL3. The bridge patterns BP-T overlap the third sensing lines TL3 in a plane.

Figure 7:
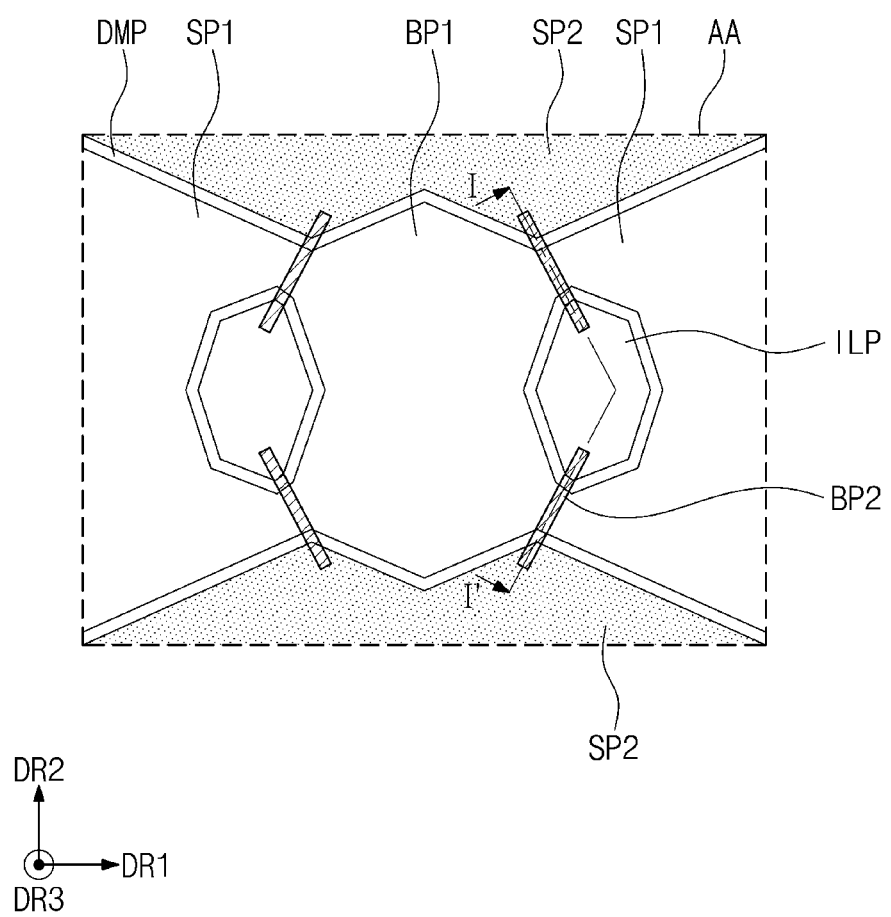
FIG. 7 is an enlarged, cutaway plan view of area AA of FIG. 6A.
Figure 8A:
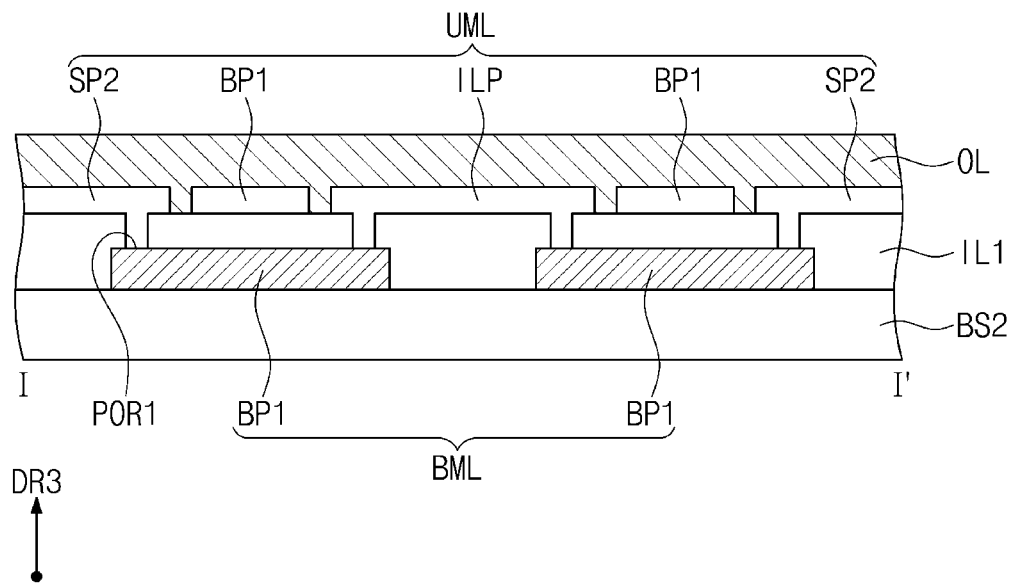
FIGS. 8A and 8B are cross-sectional views taken along line I-I' of FIG. 7.
Figure 8B:
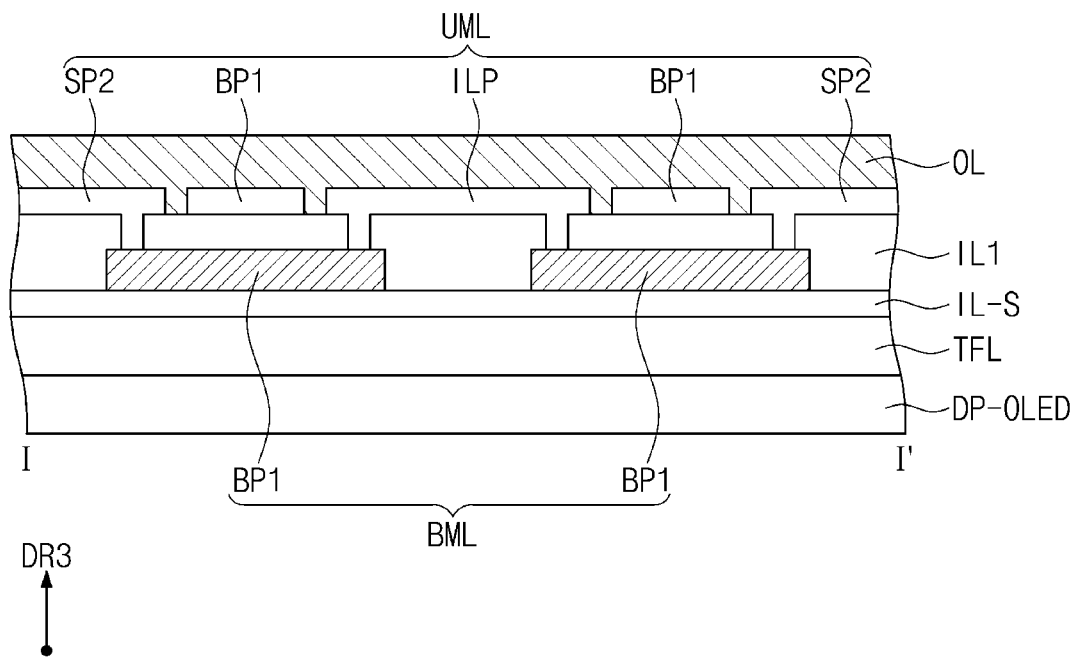

FIG. 7 is an enlarged, cutaway plan view of area AA of FIG. 6A. FIGS. 8A and 8B are cross-sectional views taken along line I-I' of FIG. 7. For clarity, FIG. 7 does not show certain elements referenced by and shown in FIGS. 8A, 8B, and 10, as discussed below.

Referring to FIGS. 3A, 7, and 8A, the sensing circuit layer ML-T may be disposed on the second substrate BS2. The sensing circuit layer ML-T includes a first conductive layer BML, a first insulation layer IL1 disposed on the first conductive layer BML with at least a portion PORI exposed, a second conductive layer UML disposed on the first insulation layer IL1, and a second insulation layer OL disposed on the second conductive layer UML. Referring to FIGS. 3B and 8B, the sensing circuit layer ML-T may be disposed on the thin film encapsulation layer TFL. An intermediate insulation layer IL-S may be further disposed between the sensing circuit layer ML-T and the thin film encapsulation layer TFL. In some exemplary embodiments, the intermediate insulation layer IL-S may be omitted.

The first conductive layer BML may be a layer including an opaque conductive material. For example, the first conductive layer BML may include a metal material, for example, may include at least one of molybdenum, silver, titanium, copper, aluminum, or an alloy thereof. The alloy may be, for example, molybdenum niobium.

The first conductive layer BML may include second connection patterns BP2. In some exemplary embodiments, four second connection patterns BP2 are exemplarily disposed to connect two second sensing patterns SP2 to each other, but some exemplary embodiments are not limited thereto. Each of the second connection patterns BP2 may be connected to one second sensing pattern SP2 and an island pattern ILP. Two second sensing patterns SP2 spaced apart from each other may be electrically connected to each other through the second connection patterns BP2 and the island pattern ILP.

The first insulation layer IL1 may be disposed on the first conductive layer BML to cover the first conductive layer BML. The first insulation layer IL1 may include an inorganic material. The inorganic material may include at least one of a silicon oxide, a silicon nitride, a silicon oxy nitride, a titanium oxide, or an aluminum oxide.

The second conductive layer UML may be a layer including a transparent conductive material. The transparent in this specification may mean that light transmittance is greater than or equal to a predetermined reference. For example, the predetermined reference may be about 90%, but some exemplary embodiments are not limited thereto. The second conductive layer UML may include a transparent conductive oxide, for example, at least one of an indium tin oxide (ITO), an indium zinc oxide (IZO), an indium gallium oxide (IGO), and an indium zinc gallium oxide (IGZO), or a mixture/compound thereof. However, the some exemplary embodiments are not limited thereto.

The second conductive layer UML may include first sensing patterns SP1, first connection patterns BP1, and second sensing patterns SP2. Also, the second conductive layer UML may further include an island pattern ILP. The island pattern ILP may be insulated from the first sensing patterns SP1 and the first connection patterns BP1 and electrically connected to the second sensing patterns SP2.

The second insulation layer OL may be disposed on the second conductive layer UML to cover the second conductive layer UML. The second conductive layer UML may cover at least a portion of the second conductive layer UML.

The second insulation layer OL may include an organic material. The second insulation layer OL may include a polymer material. In some exemplary embodiments, the second insulation layer OL may include a polyester. The second insulation layer OL may be formed by printing polyester on the second conductive layer UML through a screen printing process. The second insulation layer OL may include an uncured or curable polyester.

Figure 9:
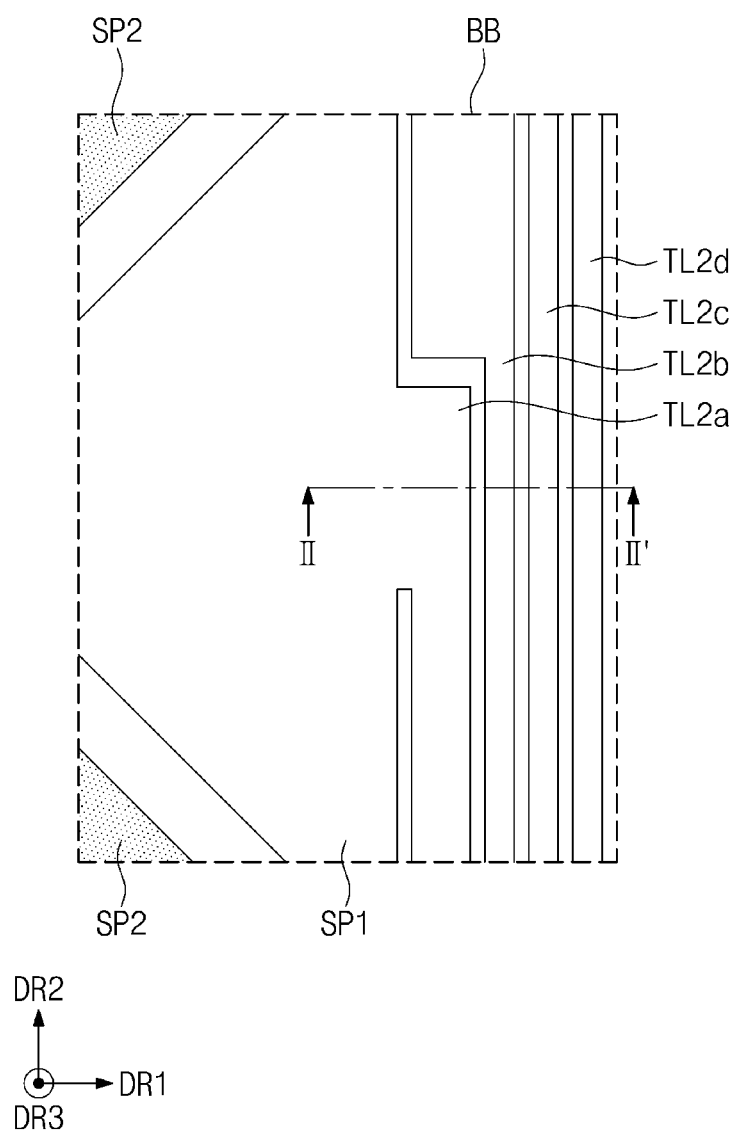
FIG. 9 is an enlarged, cutaway plan view of area BB of FIG. 6A.
Figure 10:
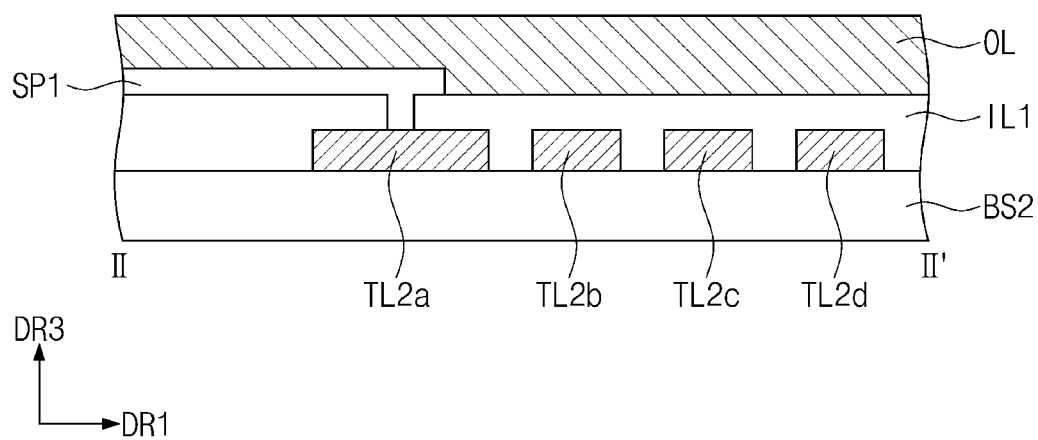
FIG. 10 is a cross-sectional view taken along line II-IF of FIG. 9.

FIG. 9 is an enlarged, cutaway plan view of area BB of FIG. 6A. FIG. 10 is a cross-sectional view taken along line II-IF of FIG. 9. For clarity, FIG. 9 does not show certain elements referenced by and shown in FIG. 10, as discussed below.

FIGS. 9 and 10 illustrate some of the second sensing lines TL2 connected to the second sensing patterns SP2 among the plurality of sensing lines TL1, TL2, and TL3 described with reference to FIG. 6. Hereinafter, according to some exemplary embodiments, the first to fourth sub sensing lines TL2a, TL2b, TL2c, and TL2d of the second sensing lines TL2 are described. Also, a structure of each of the first to fourth sub sensing lines TL2a, TL2b, TL2c, and TL2d, which will be described below, may be equally applied to each of the remaining sensing lines.

As described above, the first to fourth sub sensing lines TL2a, TL2b, TL2c, and TL2d may transmit driving signals to the first sensing patterns SP1, respectively. In some exemplary embodiments, the first to fourth sub sensing lines TL2a, TL2b, TL2c, and TL2d are included in the first conductive layer, and any one of the first sensing patterns SP1 and the first sub sensing line TL2a may be connected. In some exemplary embodiments, the first sensing pattern SP1 may be disposed on the first insulation layer IL1 and may be connected to the first sub sensing line TL2a through a contact hole defined in the first insulation layer ILL A second insulation layer OL may be disposed on the first sensing patterns SP1 and the first to fourth sub sensing lines TL2a, TL2b, TL2c, and TL2d, and the second insulation layer OL may cover the first sensing patterns SP1 and the first to fourth sub sensing lines TL2a, TL2b, TL2c, and TL2d.

Figure 11:
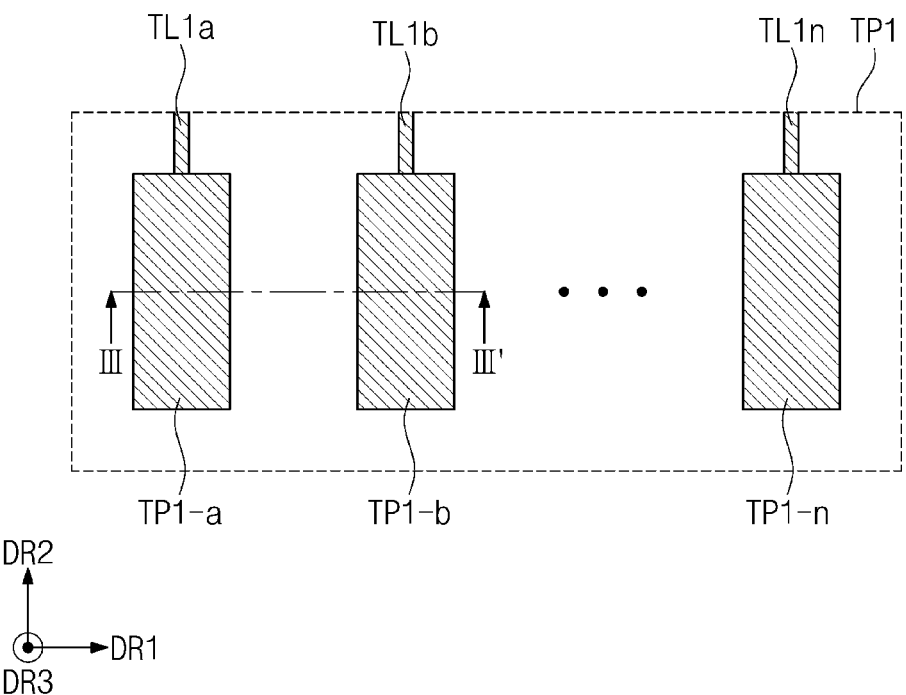
FIG. 11 is an enlarged view illustrating a portion of a sensing pad unit of FIG. 6A.
Figure 12:
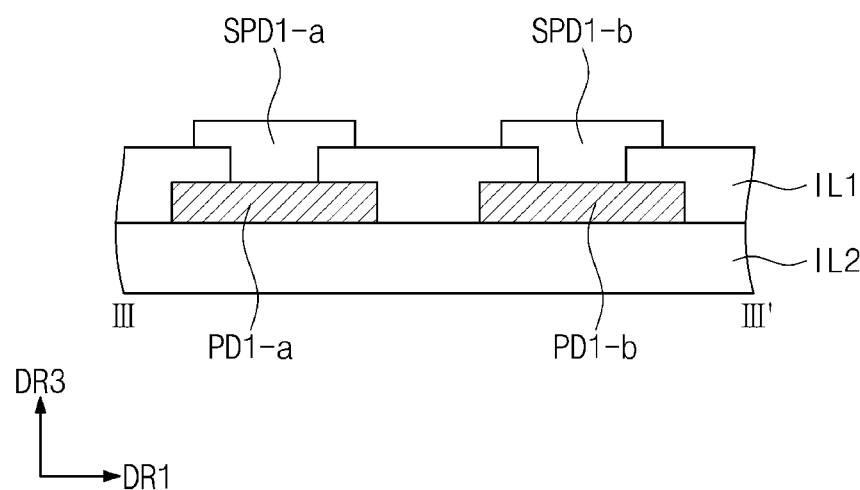
FIG. 12 is a cross-sectional view taken along line of FIG. 11.

FIG. 10 is a cross-sectional view taken along line II-IF of FIG. 9. FIG. 11 is an enlarged view illustrating a portion of a sensing pad unit of FIG. 6A. Referring to FIGS. 11 and 12, the first sensing pad TP1 includes a plurality of first sub sensing pads TP1-a, TP1-b, and TP1-n, and the first sub sensing pads TP1-a, TP1-b, and TP1-n may be connected, respectively, to the plurality of sub sensing lines TL1a, TL1b, and TL1n.

Each of the plurality of first sub sensing pads TP1-a and TP1-b may include a plurality of pads PD1-a and PD1-b and a plurality of auxiliary pads SPD1-a and SPD1-b. The plurality of pads PD1-a and PD1-b may be provided in the first conductive layer, and the plurality of auxiliary pads SPD1-a and SPD1-b may be provided in the second conductive layer. The plurality of pads PD1-a and PD1-b and the auxiliary pads SPD1-a and SPD1-b may be connected to each other by a second contact hole CNT2-1 (see FIG. 13B) defined in the first insulation layer IL1.

The second insulation layer OL may not be disposed on the first sensing pad TP1. That is, the second insulation layer OL may be patterned to expose the sensing pads so that the second insulation layer OL is not disposed on the area on which the sensing pads are disposed on the peripheral area NAA-I. Since the second insulation layer OL is omitted on the sensing pads, the plurality of auxiliary pads SPD1-a and SPD1-b disposed on the first insulation layer IL1 may be exposed.

FIGS. 13A to 13D are plan views illustrating various layers of the input sensing unit constructed according to principles of the invention. For clarity, FIGS. 13A-C do not show certain elements referenced by and shown in FIG. 13D, as discussed below.

Figure 13A:
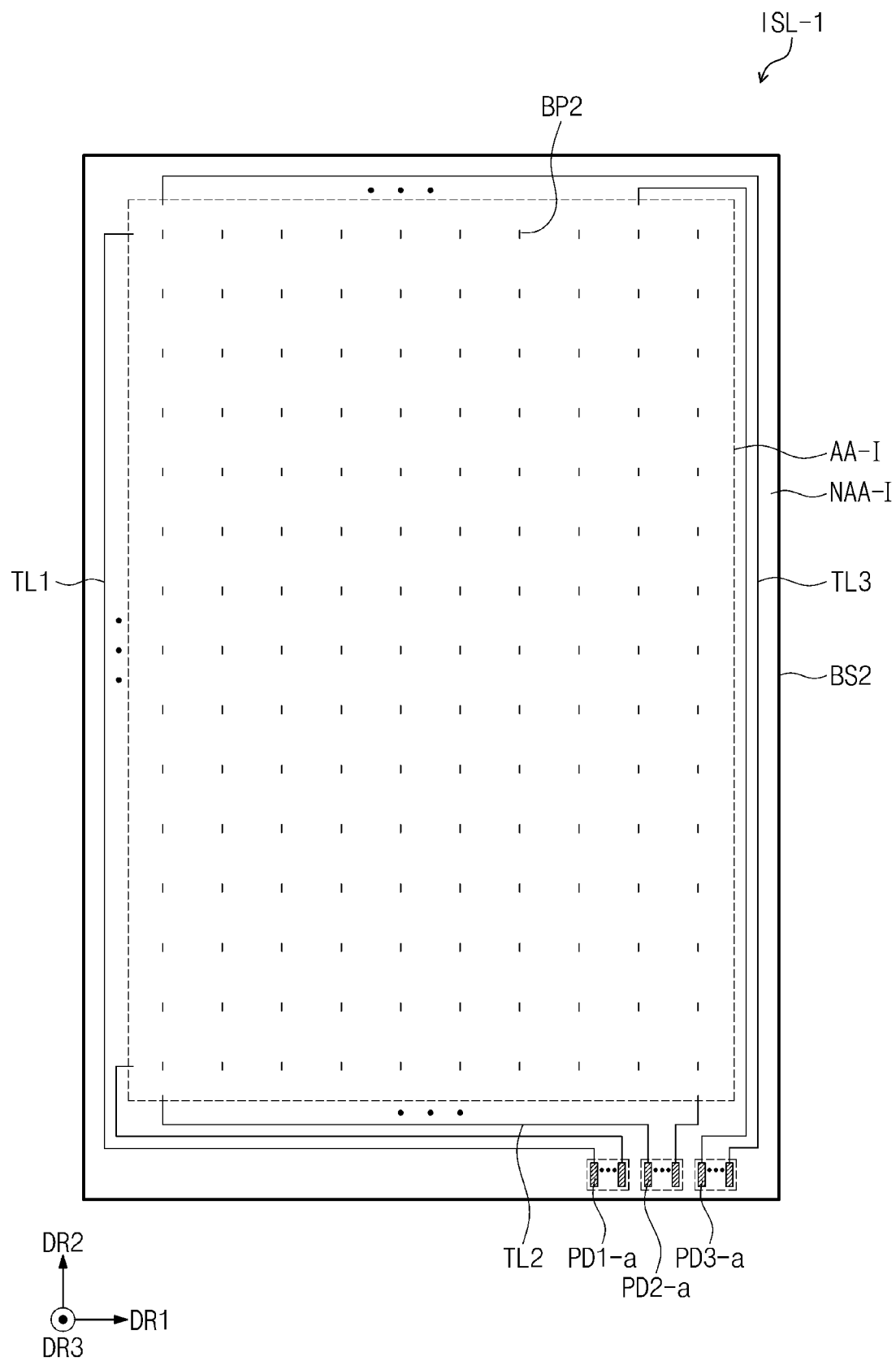
FIGS. 13A to 13D are plan views illustrating various layers of the input sensing unit constructed according to principles of the invention.

Referring to FIGS. 6 and 13A, the first layer ISL-1 of the input sensing unit ISL according to some exemplary embodiments include a first conductive layer. The first conductive layer may be a layer disposed closest to the display panel. For example, the first conductive layer may be a layer constituted by patterns directly disposed on the second substrate BS2 or the thin film encapsulation layer TFL (see FIG. 3B) of the display panel.

The first conductive layer may include a second connection pattern BP2, a plurality of sensing lines TL1, TL2, and TL3, and a plurality of pads PD1-a, PD2-a, and PD3-a. A conductive material may be deposited on a base surface provided by the second substrate BS2 and then patterned to form the second connection pattern BP2, the plurality of sensing lines TL1, TL2, and TL3, and the pads PD1-a, PD2-a, and PD3-a, which are provided in the first conductive layer. The second connection pattern BP2, the plurality of sensing lines TL1, TL2, and TL3, and the plurality of pads PD1-*a*, PD2-*a*, and PD3-*a*, which are provided in the first conductive layer, may have the same material and the same thickness.

The second connection pattern BP2, the plurality of sensing lines TL1, TL2, and TL3, and the pads PD1-*a*, PD2-*a*, and PD3-*a*, which are provided in the first conductive layer, may be made of the same material. The metallic material may include molybdenum, silver, titanium, copper, aluminum, or an alloy thereof. The alloy may be, for example, molybdenum niobium.

Each of the second connection pattern BP2, the plurality of sensing lines TL1, TL2, and TL3, and the plurality of pads PD1-*a*, PD2-*a*, and PD3-*a*, which are provided in the first conductive layer, may have a predetermined thickness in the third direction. For example, each of the second connection pattern BP2, the plurality of sensing lines TL1, TL2, and TL3, and the plurality of pads PD1-*a*, PD2-*a*, and PD3-*a* may have a thickness of about 400 μm.

Figure 13B:
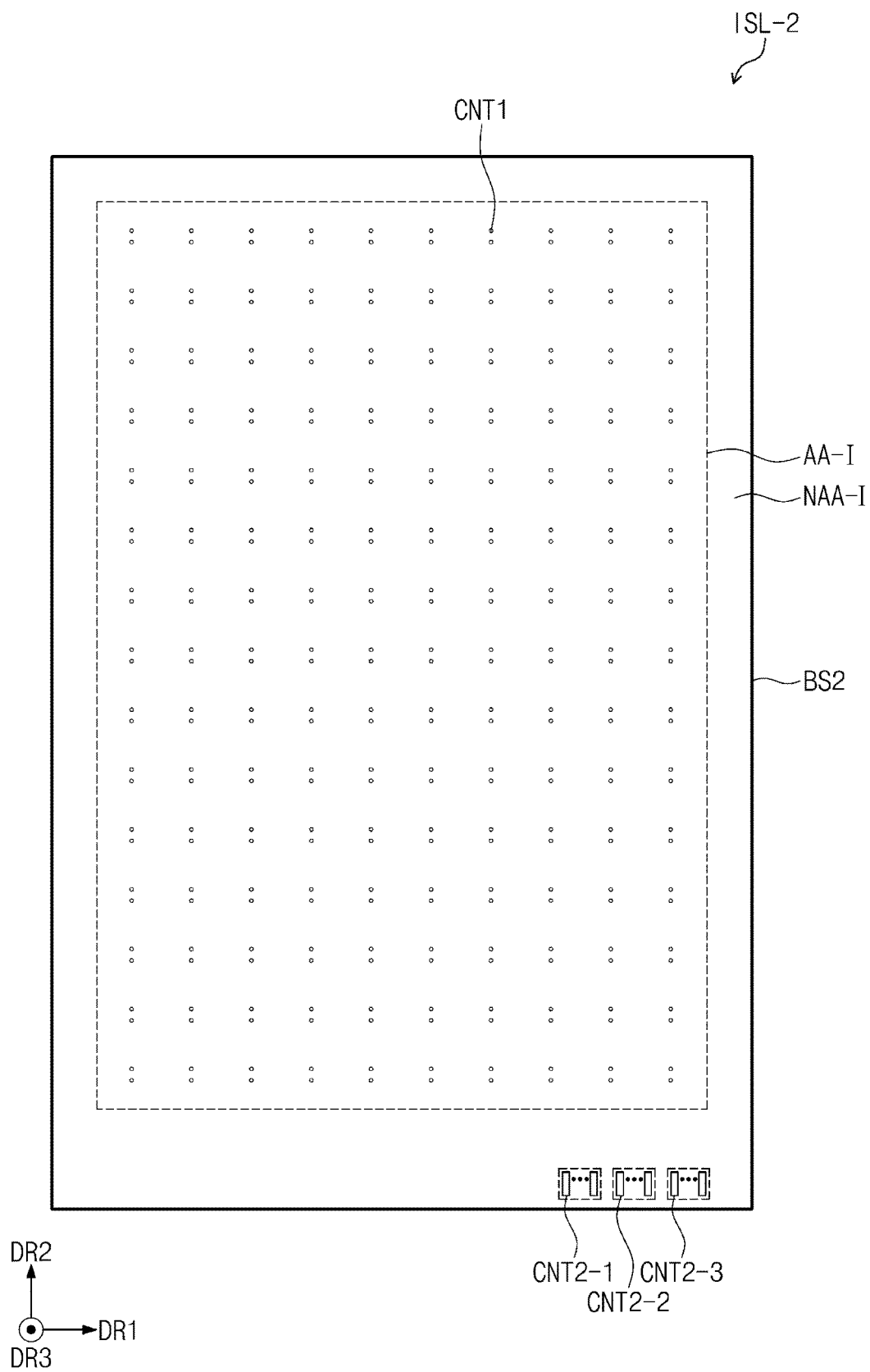

Referring to FIGS. 6, 8, and 13B, the second layer ISL-2 of the input sensing unit ISL according to an embodiment includes a first insulation layer IL1.

A plurality of contact holes CNT1, CNT2-1, CNT2-2, and CNT2-3 may be defined in the first insulation layer IL1. The first insulation layer IL1 may pass through the plurality of contact holes CNT1, CNT2-1, CNT2-2, and CNT2-3 in the third direction DR3.

The first contact holes CNT1 are defined in the active area AA-I. In more detail, the first contact holes CNT1 may overlap the corresponding second connection patterns BP2 (see FIG. 13A). Accordingly, a portion of each of the plurality of second connection patterns BP2 may be exposed from the first insulation layer IL1 by each of the first contact holes CNT1.

The second contact holes CNT2-1, CNT2-2, and CNT2-3 are defined in the peripheral area NAA-I. In more detail, the second contact holes CNT2-1, CNT2-2, and CNT2-3 may overlap the corresponding pads PD1-*a*, PD2-*a*, and PD3-*a*. Therefore, a portion of each of the pads PD1-*a*, PD2-*a*, and PD3-*a* may be exposed from the first insulation layer IL1 by each of the second contact holes CNT2-1, CNT2-2, and CNT2-3.

The first insulation layer IL1 may include an inorganic material. For example, the first insulation layer IL1 may include at least one of a silicon nitride, a silicon oxy nitride, or a silicon oxide.

The first insulation layer IL1 may have a thickness of about 2,000 μm to about 2,700 μm. When the thickness of the first insulation layer IL1 is no more than about 2,000 μm, insulation function between the first conductive layer and the second conductive layer may be deteriorated to cause short circuit between the first conductive layer and the second conductive layer. When the thickness of the first insulation layer IL1 is at least about 2,700 μm, transmittance of the display device may decrease.

Figure 13C:
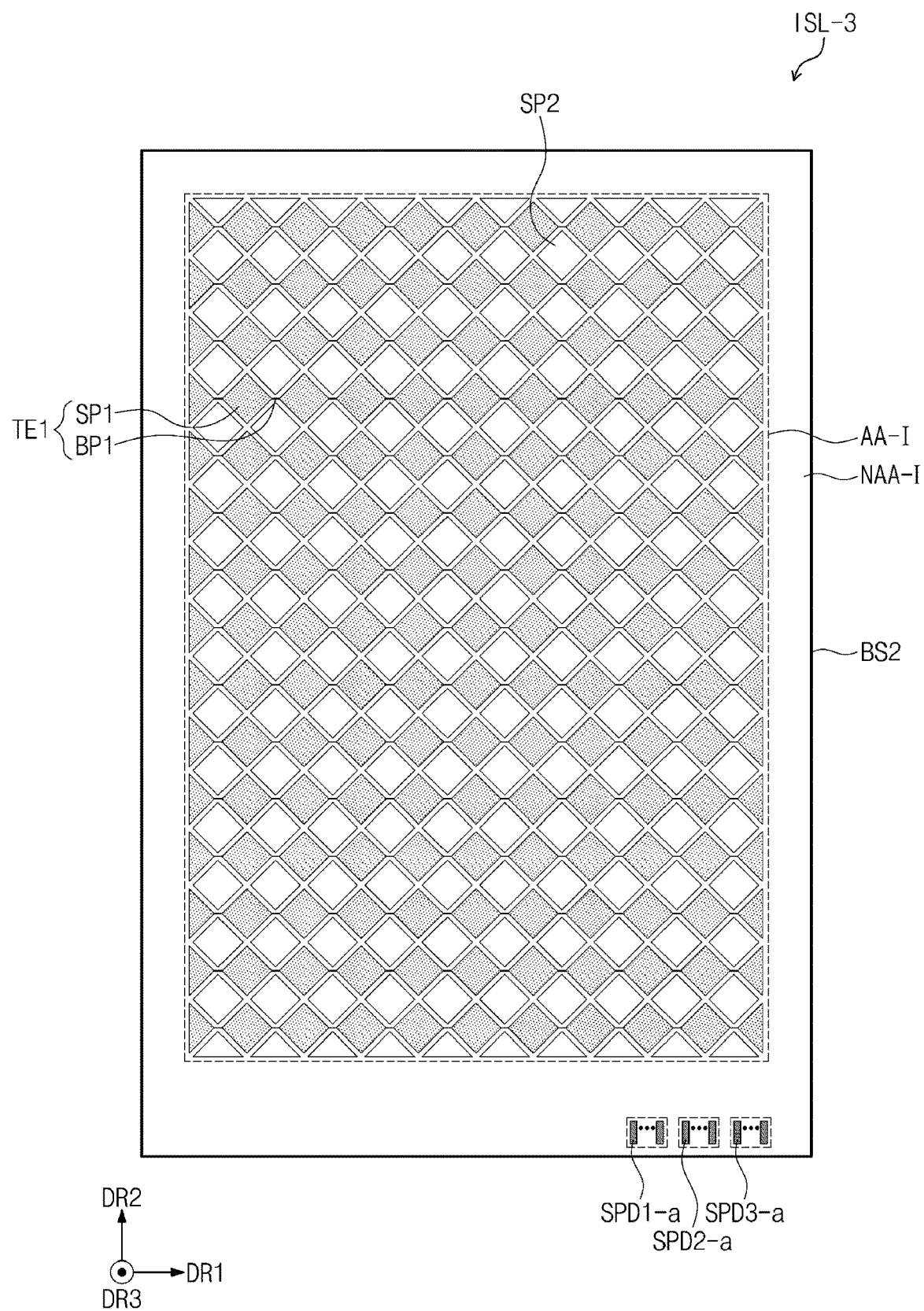

Referring to FIGS. 6 and 13C, the third layer ISL-3 of the input sensing unit ISL according to some exemplary embodiments includes a second conductive layer. The second conductive layer is disposed on the first insulation layer IL1.

The second conductive layer may include a first sensing pattern SP1, a second sensing pattern SP2, a first connection pattern BP1, and a plurality of auxiliary pads SPD1-*a*, SPD2-*a*, and SPD3-*a*.

A conductive material may be applied and patterned to form the first sensing pattern SP1, the second sensing pattern SP2, the first connection pattern BP1, and the plurality of auxiliary pads SPD1-*a*, SPD2-*a*, and SPD3-*a*, which are provided in the second conductive layer. Therefore, the first sensing pattern SP1, the second sensing pattern SP2, the first connection pattern BP1, and the plurality of auxiliary pads SPD1-*a*, SPD2-*a*, and SPD3-*a* include the same material.

Each of the first sensing pattern SP1, the second sensing pattern SP2, the first connection pattern BP1, and the plurality of auxiliary pads SPD1-*a*, SPD2-*a*, and SPD3-*a* includes a transparent conductive oxide, for example, may include at least one of an indium tin oxide (ITO), an indium zinc oxide (IZO), an indium gallium oxide (IGO), an indium zinc gallium oxide (IGZO), or a mixture/compound thereof. However, some exemplary embodiments are not limited thereto.

Each of the second sensing patterns SP2 may be connected to the second connection pattern BP2 corresponding to each of the first contact holes CNT1 of the first insulation layer IL1. The auxiliary pads SPD1-*a*, SPD2-*a*, and SPD3-*a* may be connected to the pads PD1-*a*, PD2-*a*, and PD3-*a* corresponding to, respectively, the second contact holes CNT2-1, CNT2-2, and CNT2-3 of the first insulation layer IL1.

Each of the first sensing pattern SP1, the second sensing pattern SP2, the first connection pattern BP1, and the plurality of auxiliary pads SPD1-*a*, SPD2-*a*, and SPD3-*a*, provided in the second conductive layer, may have a predetermined thickness in the third direction D3. For example, each of the first sensing pattern SP1, the second sensing pattern SP2, the first connection pattern BP1, and the plurality of auxiliary pads SPD1-*a*, SPD2-*a*, and SPD3-*a* may have a thickness of about 400 μm.

Figure 13D:
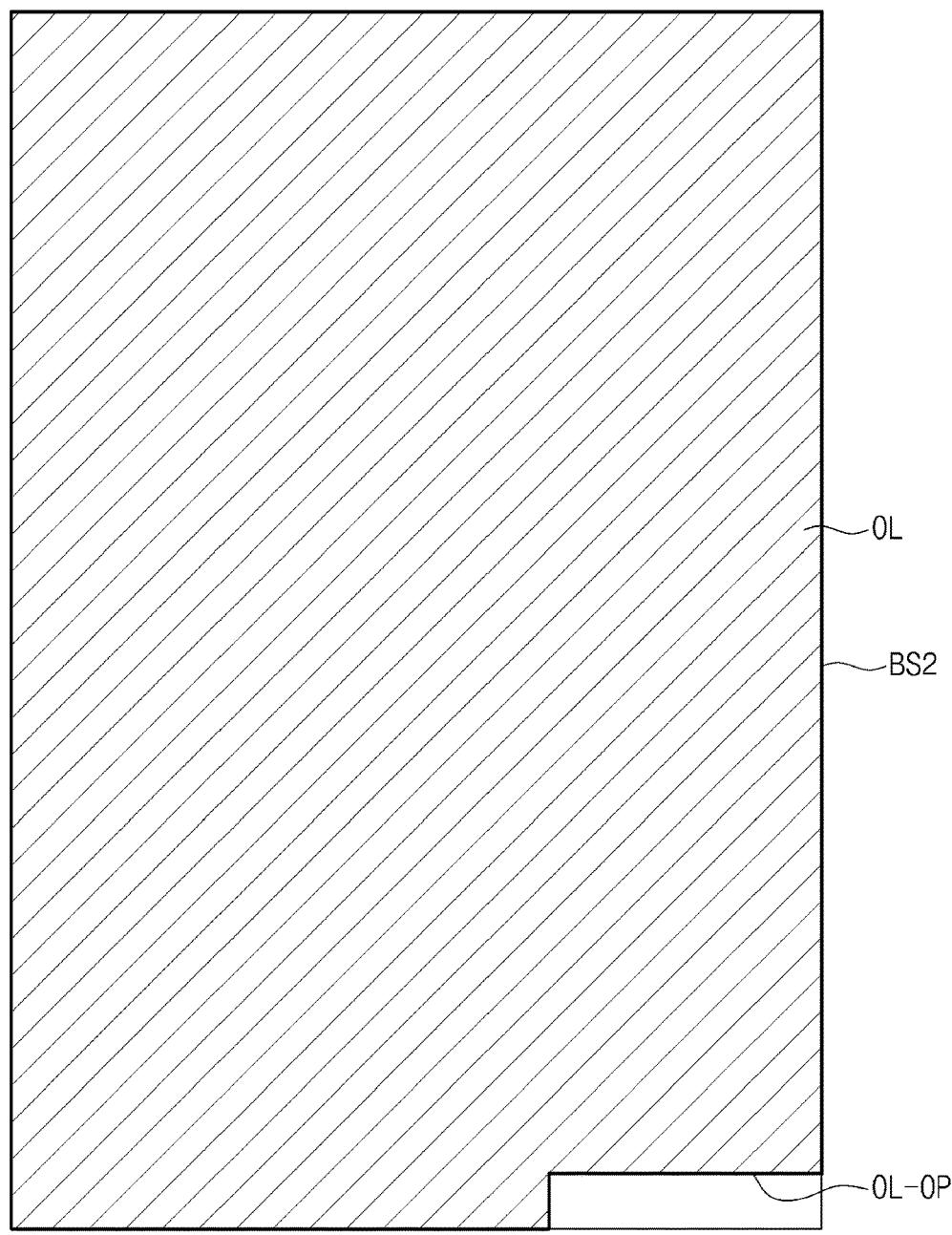

Referring to FIGS. 6 and 13D, the fourth layer ISL-4 of the input sensing unit ISL according to some exemplary embodiments includes a second insulation layer OL. The second insulation layer OL may be disposed at the uppermost side of the input sensing unit ISL to cover the first to third layers ISL-1, ISL-2, and ISL-3 of the input sensing unit ISL described above.

The second insulation layer OL may include an organic material. The second insulation layer OL may include a polymer material. The second insulation layer OL may include a polyester. The second insulation layer OL may be formed by printing polyester on the second conductive layer through a screen printing process.

An opening OL-OP may be defined in the second insulation layer OL. The openings OL-OP of the second insulation layer OL may be defined at positions on which the sensing pads PDT are disposed on the peripheral area NAA-I to expose, respectively, the sensing pads PDT. As the second insulation layer OL is omitted on the sensing pads PDT by the openings OL-OP of the second insulation layer OL, the plurality of auxiliary pads SPD1-*a*, SPD2-*a*, and SPD3-*a* may be exposed. The sensing pads PDT may be exposed by the openings OL-OP of the second insulation layer OL so as to be electrically connected to the second circuit board CF2 (see FIG. 2) by a conductive film.

The second insulation layer OL may have a thickness of about 2,000 μm to about 2,700 μm. When the thickness of the second insulation layer OL is less than about 2,000 μm, moisture and oxygen introduced from the outside may not be sufficiently blocked. When the thickness of the second insulation layer OL is greater than about 2,700 μm, the transmittance of the display device may decrease.

In the display device according to some exemplary embodiments, the insulation layer disposed at the uppermost side of the insulation layer provided in the input sensing unit includes an organic material, and more specifically, may be formed by printing a polymer material such as a polyester through a screen printing method. As a result, when compared to the case in which the insulation layer to be disposed at the uppermost side is made of an inorganic material, the mask process may be omitted to simplify the process and reduce the manufacturing cost. In addition, even if the inorganic insulation layer is omitted, the organic insulation layer formed through the screen printing may be disposed to prevent the sensing pattern including the transparent conductive oxide from being seen from the outside and prevent defects of the sensing line including the metal material from occurring due to moisture and oxygen being introduced from the outside.

Figure 14A:
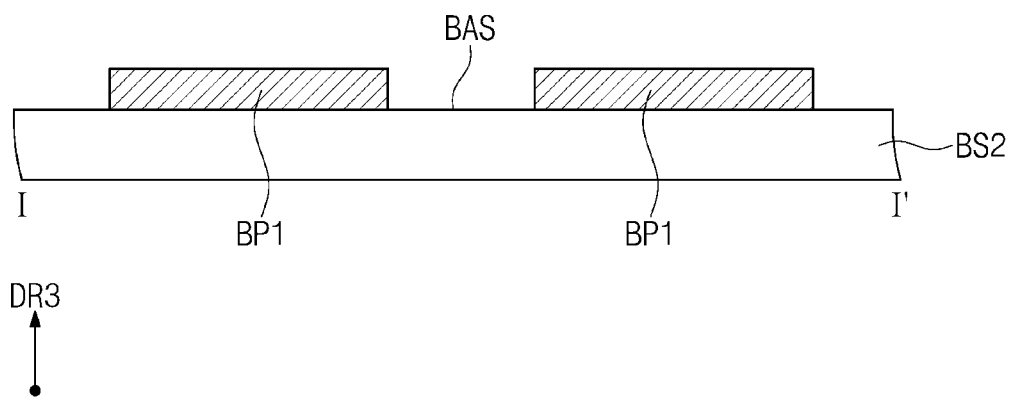
FIGS. 14A to 14C are cross-sectional views sequentially illustrating partial processes of an exemplary method for manufacturing a display device according to principles of the invention.
Figure 14B:
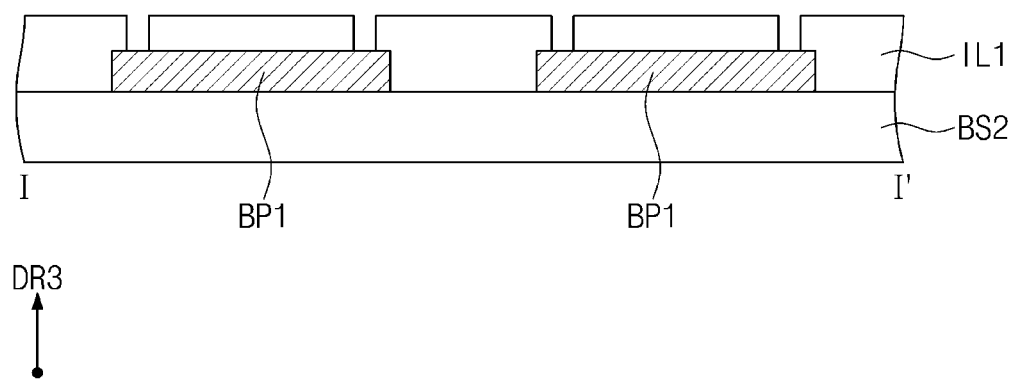
Figure 14C:
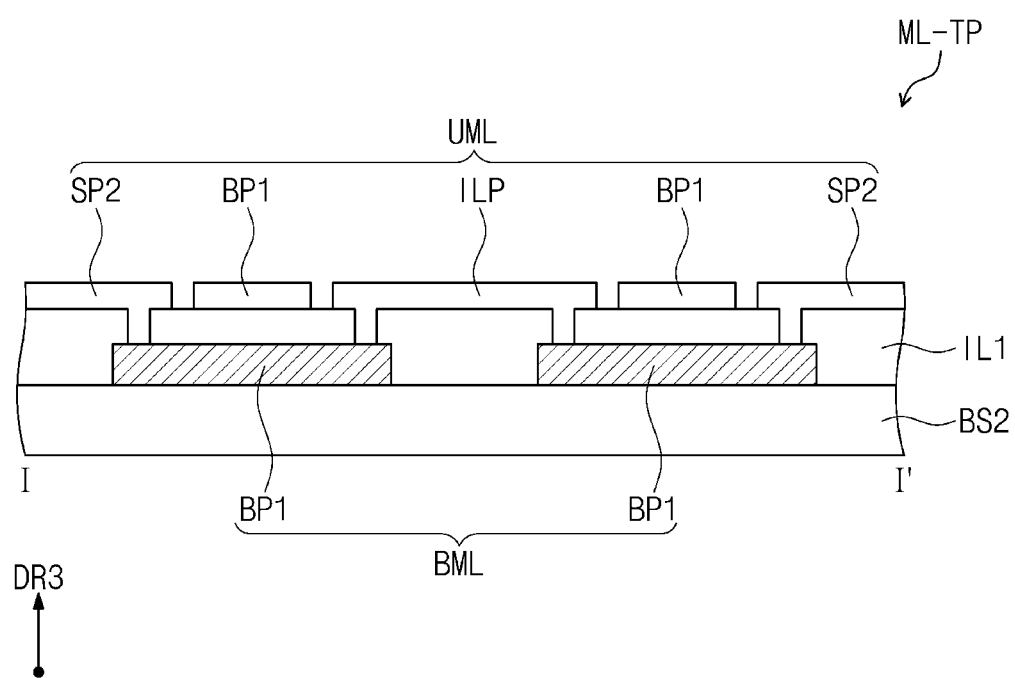
Figure 15A:
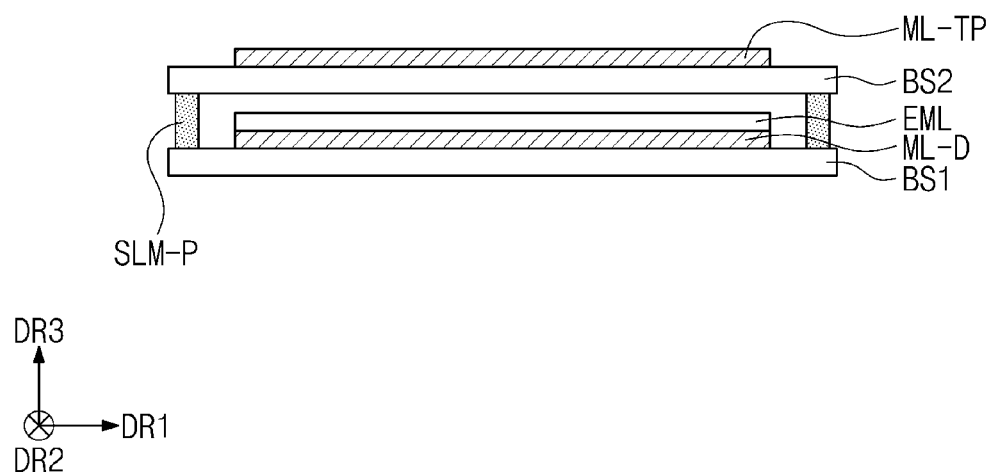
FIGS. 15A to 15C are cross-sectional views sequentially illustrating partial processes of another exemplary method for manufacturing a display device according to principles of the invention.
Figure 15B:
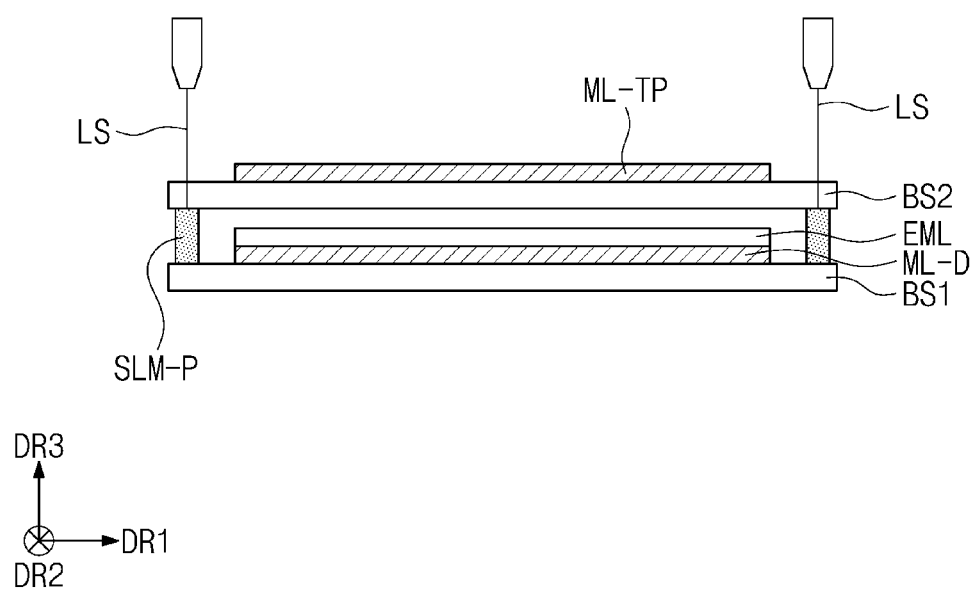
Figure 15C:
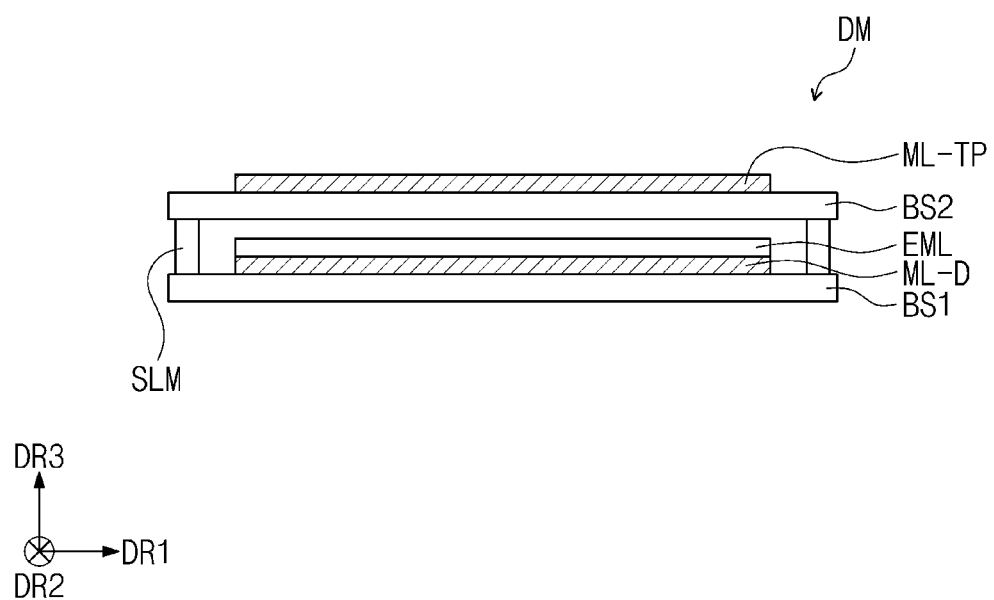
Figure 16:
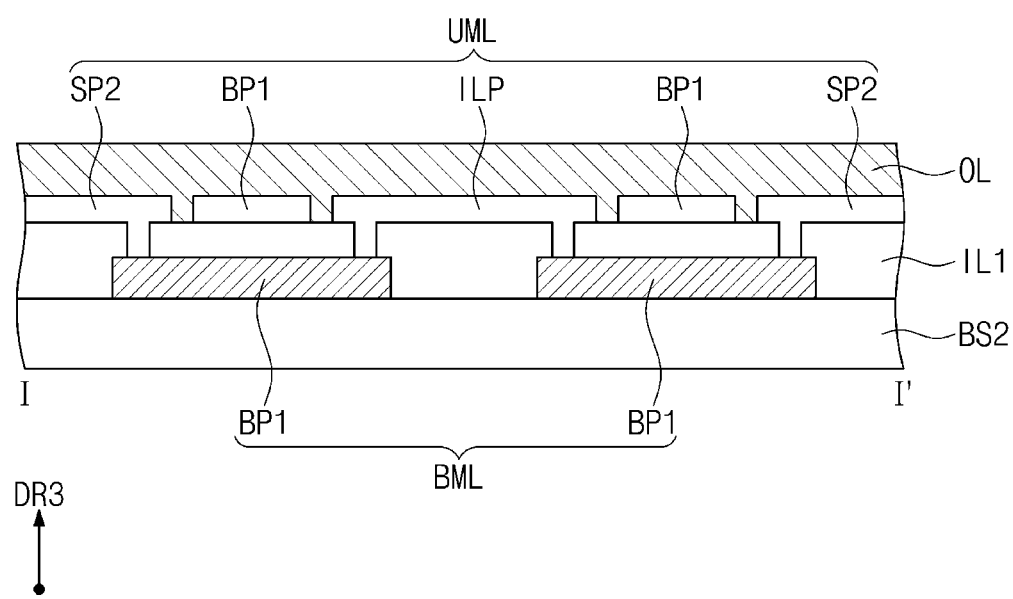
FIG. 16 is a cross-sectional view illustrating a partial process of another exemplary method for manufacturing a display device according to principles of the invention.

FIGS. 14A to 14C are cross-sectional views sequentially illustrating partial processes of an exemplary method for manufacturing a display device according to principles of the invention. FIGS. 15A to 15C are cross-sectional views sequentially illustrating partial processes of another exemplary method for manufacturing a display device according to principles of the invention. FIG. 16 is a cross-sectional view illustrating a partial process of another exemplary method for manufacturing a display device according to principles of the invention. Hereinafter, a method of manufacturing a display device according to some exemplary embodiments will be described with reference to FIGS. 14A to 16.

A method of manufacturing the display device according to some exemplary embodiments includes a process of preparing a display panel and a process of forming an input sensing unit on the display panel.

FIGS. 14A to 14C illustrate processes of forming an input sensing unit in a cross-section taken along line I-I' of FIG. 6A.

Referring to FIGS. 3A, 9 and 14A to 14C, the process of forming the input sensing unit includes a process of forming a base member BS2 providing a base surface BAS, a process of forming a first conductive layer BML on the base member BS2, a process of forming a first insulation layer IL1 on the first conductive layer BML, and a process of forming a second conductive layer UML on the first insulation layer IL1.

The base member BS2 may provide the base surface BAS on which a sensing circuit layer ML-T of an input sensing unit is formed. Although the base member BS2 providing the base surface BAS is a second substrate BS2, i.e., an encapsulation layer in FIGS. 14A to 16, some exemplary embodiments are not limited thereto. For example, the base member BS2 providing the base surface BAS may be the encapsulation layer TFL (see FIG. 3B).

The first conductive layer BML may be formed by depositing a conductive material and then patterning the deposited conductive material. The connection pattern BP1, which may be a second connection pattern, may be provided in the first conductive layer may be formed by depositing a metal material and then patterning the deposited metal material. The first conductive layer BML may be made of molybdenum niobium.

The first insulation layer IL1 may be formed by depositing an inorganic material on the first conductive layer BML. After depositing at least one of a silicon nitride, a silicon oxy nitride, or a silicon oxide, the first insulation layer IL1 may be patterned to form a contact hole in a portion at which the first conductive layer BML and the second conductive layer UML are connected.

The second conductive layer UML may be formed by depositing a conductive material on the first insulation layer IL1 and then patterning the deposited conductive material. A first sensing patterns SP1, a second sensing patterns SP2, a first connection pattern BP1, an island pattern ILP, and the like, which are provided in the second conductive layer UML, may be formed by depositing a transparent conductive oxide on the first insulation layer IL1 and then patterning the deposited the transparent conductive oxide. The second conductive layer may be made of indium tin oxide (ITO).

The first conductive layer BML, the first insulation layer ILL and the second conductive layer UML, which are formed sequentially on the base surface of the base member, may be defined as a preliminary sensing circuit layer ML-TP.

FIGS. 15A to 15C illustrate a schematic cross-section corresponding to the cross-section of FIG. 3A.

Referring to 15A to 15C, the method for manufacturing the display device EA may further include a process of curing the base material contained in the base member BS2 after the preliminary sensing circuit layer ML-TP is formed on the base member BS2. The base member BS2 may include a second substrate BS2 and a coupling member SLM that connects the first substrate BS1 to the second substrate BS2. In more detail, a preliminary coupling member SLM-P may be disposed between the first substrate BS1 and the second substrate BS2, and the base material contained in the preliminary coupling member SLM-P may be cured to form the coupling member SLM, thereby connecting the first substrate BS1 to the second substrate BS2.

Although the base material contained in the preliminary coupling member is cured by light LS such as laser beams in FIGS. 15A to 15C, some exemplary embodiments are not limited thereto. For example, the base material may be cured by heat or the like.

Referring to FIG. 16, the method for manufacturing the display device may further include a process of a second insulation layer OL including an organic material deposed on the second conductive layer UML. The process of forming the second insulation layer OL is performed after curing the base material contained in the coupling member SLM. The process of forming the second insulation layer OL is performed after curing the base material included in the coupling member SLM. The second insulation layer OL may be formed by applying the organic material through a screen printing method.

The method of manufacturing the display device may include a process of forming an organic insulation layer after forming the insulation layer disposed at the uppermost side of the input sensing unit using an organic material, and more specifically, curing the base material contained in the base member through the heat and/or light. As a result, an occurrence of out gassing in the organic insulation layer due to the process of curing the base material through the heat and/or light may be prevented, and thus, the organic insulation layer may be maintained without changing the insulation properties. Therefore, the reliability of the display device formed through the method for manufacturing the display device according to some exemplary embodiments may be improved.

According to principles and exemplary embodiments of the invention, a display device having superior insulation characteristics may be manufactured while reducing the manufacturing cost by simplifying the process of forming the input sensing unit of the display device, thereby improving the reliability of the display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel; and
   an input sensing unit disposed on the display panel and including an active area and a peripheral area adjacent to the active area; wherein the input sensing unit comprises:
      a first conductive layer disposed on at least the peripheral area;
      a first insulation layer disposed on the first conductive layer exposing at least a portion of the first conductive layer;
      a second conductive layer disposed on the first insulation layer and including sensing patterns; and
      a second insulation layer comprising an organic material disposed on the second conductive layer,
      wherein the sensing patterns comprise first sensing patterns overlapping the active area and second sensing patterns spaced apart from the first sensing patterns, and
      the second conductive layer further comprises first connection patterns to connect two adjacent first sensing patterns of the first sensing patterns to each other, and the first conductive layer comprises second connection patterns to connect two adjacent second sensing patterns of the second sensing patterns to each other.

2. The display device of claim 1, wherein the organic material comprises a polyester.

3. The display device of claim 1, wherein the first conductive layer comprises:
   sensing lines disposed on the peripheral area; and
   pads connected to respective ones of the sensing lines.

4. The display device of claim 3, wherein the second conductive layer further comprises auxiliary pads respectively connected to the pads.

5. The display device of claim 4, wherein the first insulation layer comprises:
   a first contact hole defined in the active area to connect a corresponding second connection pattern to a second sensing pattern; and
   a second contact hole defined in the peripheral area to connect a corresponding pad to an auxiliary pad.

6. The display device of claim 3, wherein the second insulation layer overlaps the sensing patterns and the sensing lines.

7. The display device of claim 4, wherein the second insulation layer includes an opening through which the auxiliary pads are exposed.

8. The display device of claim 1, wherein the second conductive layer comprises a transparent conductive oxide.

9. The display device of claim 1, wherein the first conductive layer comprises a metal material.

10. The display device of claim 1, wherein the display panel comprises:
    a display substrate;
    a display element layer disposed on the display substrate; and
    an encapsulation layer to seal the display element layer;
    wherein the first conductive layer is disposed on the encapsulation layer.

11. The display device of claim 10, wherein the encapsulation layer comprises an encapsulation substrate, and the display panel further comprises a member to connect the encapsulation substrate to the display substrate.

12. A display device comprising:
    a display panel; and
    an input sensing unit disposed on the display panel and including an active area and a peripheral area adjacent to the active area; wherein the input sensing unit comprises:
       a first conductive layer disposed on at least the peripheral area;
       a first insulation layer disposed on the first conductive layer exposing at least a portion of the first conductive layer;
       a second conductive layer disposed on the first insulation layer and including sensing patterns; and
       a second insulation layer comprising an organic material disposed on the second conductive layer,
    wherein the display panel comprises:
       a display substrate;
       a display element layer disposed on the display substrate; and
       an encapsulation layer to seal the display element layer,
    wherein the first conductive layer is disposed on the encapsulation layer, and
    wherein the display device further comprising a coupling member comprising a cured base material.

13. A method of manufacturing a display device, the method comprising the steps of:
    preparing a display panel; and
    forming an input sensing unit on the display panel by:
       forming a base member from a base material to provide a base surface;
       forming a first conductive layer on the base member;
       forming a first insulation layer on the first conductive layer to expose at least a portion of the first conductive layer;
       depositing a transparent conductive oxide on the first insulation layer to form a second conductive layer;
       curing the base material; and
       forming a second insulation layer comprising an organic material on the second conductive layer.

14. The method of claim 13, wherein the step of forming of the second insulation layer comprises applying the organic material through a screen printing method.

15. The method of claim 13, wherein the organic material comprises a polyester.

16. The method of claim 13, wherein step of forming the second conductive layer comprises forming:
    first sensing patterns and second sensing patterns spaced apart from the first sensing patterns, and
    first connection patterns connecting two adjacent first sensing patterns of the first sensing patterns to each other, and
    the step of forming the first conductive layer comprises forming second connection patterns connecting two adjacent second sensing patterns of the second sensing patterns to each other.

17. The method of claim 16, wherein the first conductive layer comprises:
    sensing lines; and
    pads connected to respective sensing lines.

18. The method of claim 17, wherein the second conductive layer further comprises auxiliary pads connected to respective pads.

19. The method of claim 18, wherein the second insulation layer overlaps the sensing patterns and the sensing lines and has an opening through which the auxiliary pads are exposed.

20. The method of claim 13, wherein the base member comprises:
- an encapsulation substrate forming a base surface on which the first conductive layer is formed; and
- a member connecting the encapsulation substrate to the display panel.

* * * * *